(12) United States Patent
Chiu

(10) Patent No.: US 12,334,463 B2
(45) Date of Patent: Jun. 17, 2025

(54) SEMICONDUCTOR STRUCTURE HAVING COPPER PILLAR WITHIN SOLDER BUMP AND MANUFACTURING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 448 days.

(21) Appl. No.: 17/853,978

(22) Filed: Jun. 30, 2022

(65) Prior Publication Data

US 2024/0006360 A1 Jan. 4, 2024

(51) Int. Cl.
*H01L 23/00* (2006.01)

(52) U.S. Cl.
CPC ............ *H01L 24/13* (2013.01); *H01L 24/11* (2013.01); *H01L 24/16* (2013.01); *H01L 24/81* (2013.01); *H01L 24/05* (2013.01); *H01L 2224/05555* (2013.01); *H01L 2224/05624* (2013.01); *H01L 2224/11462* (2013.01); *H01L 2224/11622* (2013.01); *H01L 2224/13007* (2013.01); *H01L 2224/13014* (2013.01); *H01L 2224/13147* (2013.01); *H01L 2224/13541* (2013.01); *H01L 2224/13553* (2013.01); *H01L 2224/13561* (2013.01); *H01L 2224/1358* (2013.01);
(Continued)

(58) Field of Classification Search
CPC ..... H01L 24/12–14; H01L 2224/13083; H01L 2224/13084; H01L 2224/10152; H01L 2224/02125; H01L 2224/1308; H01L 2224/13082
See application file for complete search history.

(56) References Cited

U.S. PATENT DOCUMENTS

| 5,508,561 A * | 4/1996 | Tago ...................... H01L 24/13 |
| | | 257/E21.511 |
| 5,889,326 A * | 3/1999 | Tanaka ................... H01L 24/81 |
| | | 257/E21.511 |

(Continued)

FOREIGN PATENT DOCUMENTS

| CN | 1929093 A | 3/2007 |
| CN | 102005417 A | 4/2011 |
| TW | 202143417 A | 11/2021 |

OTHER PUBLICATIONS

Office Action and and the search report mailed on Nov. 2, 2023 related to Taiwanese Application No. 111145464.
(Continued)

*Primary Examiner* — David A Zarneke
(74) *Attorney, Agent, or Firm* — Xuan Zhang

(57) ABSTRACT

The present application provides a semiconductor structure having a copper pillar within a solder bump, and a manufacturing method of the semiconductor structure. The semiconductor structure includes a substrate having a pad disposed thereon and a passivation at least partially surrounding the pad; and a conductive bump structure disposed over the passivation and the pad, wherein the conductive bump structure includes a first bump portion disposed over the passivation and the pad, a conductive pillar disposed over the first bump portion, and a second bump portion disposed over and surrounding the conductive pillar.

18 Claims, 32 Drawing Sheets

(52) U.S. Cl.
CPC ............... *H01L 2224/13611* (2013.01); *H01L 2224/13639* (2013.01); *H01L 2224/13647* (2013.01); *H01L 2224/13666* (2013.01); *H01L 2224/13687* (2013.01); *H01L 2224/16148* (2013.01); *H01L 2224/81203* (2013.01); *H01L 2924/3841* (2013.01)

(56) References Cited

U.S. PATENT DOCUMENTS

| | | | | |
|---|---|---|---|---|
| 7,015,590 | B2* | 3/2006 | Jeong | B23K 3/0607 |
| | | | | 257/E21.511 |
| 8,039,960 | B2* | 10/2011 | Lin | H01L 24/11 |
| | | | | 257/737 |
| 8,269,345 | B2* | 9/2012 | Patel | H01L 24/11 |
| | | | | 257/737 |
| 8,299,616 | B2* | 10/2012 | Chuang | H01L 21/50 |
| | | | | 257/773 |
| 8,698,307 | B2* | 4/2014 | Shih | H01L 24/17 |
| | | | | 257/737 |
| 8,800,142 | B2* | 8/2014 | Nang | B23K 3/0623 |
| | | | | 29/852 |
| 9,484,291 | B1* | 11/2016 | Dhandapani | H01L 24/03 |
| 9,807,732 | B1* | 10/2017 | Clark | H04W 4/12 |
| 10,236,268 | B1* | 3/2019 | Dhandapani | H01L 24/05 |
| 10,340,226 | B2* | 7/2019 | Yu | H01L 24/49 |
| 11,257,767 | B2* | 2/2022 | Yu | H01L 23/562 |
| 11,476,212 | B2* | 10/2022 | Lin | H01L 24/20 |
| 2001/0040290 | A1* | 11/2001 | Sakurai | H01L 24/13 |
| | | | | 257/737 |
| 2006/0051954 | A1* | 3/2006 | Lin | H01L 24/13 |
| | | | | 257/E23.021 |
| 2006/0065978 | A1* | 3/2006 | Nishiyama | H01L 24/11 |
| | | | | 257/E21.511 |
| 2011/0101523 | A1* | 5/2011 | Hwang | H01L 24/16 |
| | | | | 257/737 |
| 2011/0186986 | A1* | 8/2011 | Chuang | H01L 24/05 |
| | | | | 257/737 |
| 2012/0056318 | A1* | 3/2012 | Seto | H01L 24/03 |
| | | | | 257/737 |
| 2012/0067635 | A1* | 3/2012 | Nang | B23K 3/0623 |
| | | | | 228/203 |
| 2012/0068334 | A1* | 3/2012 | Migita | H01L 24/11 |
| | | | | 257/E21.174 |
| 2012/0273935 | A1* | 11/2012 | Martens | H01L 24/13 |
| | | | | 257/737 |
| 2014/0124914 | A1* | 5/2014 | Lin | H01L 24/13 |
| | | | | 438/122 |
| 2014/0124928 | A1* | 5/2014 | Lin | H01L 24/11 |
| | | | | 257/738 |
| 2014/0159235 | A1* | 6/2014 | Odaira | H01L 24/81 |
| | | | | 257/737 |
| 2014/0264890 | A1* | 9/2014 | Breuer | H01L 24/13 |
| | | | | 257/773 |
| 2015/0001704 | A1* | 1/2015 | Lu | H01L 24/81 |
| | | | | 257/737 |
| 2016/0322319 | A1* | 11/2016 | Aoki | H01L 24/13 |
| 2018/0019220 | A1* | 1/2018 | Ryu | H05K 1/111 |
| 2021/0104478 | A1* | 4/2021 | Lin | H01L 24/11 |
| 2022/0059483 | A1* | 2/2022 | Wu | H01L 24/13 |

OTHER PUBLICATIONS

Office Action and and the search report mailed on Feb. 2, 2024 related to Taiwanese Application No. 111145464.
Office Action and and the search report mailed on Apr. 18, 2024 related to Taiwanese Application No. 111145464.

* cited by examiner

SEMICONDUCTOR STRUCTURE HAVING COPPER PILLAR WITHIN SOLDER BUMP AND MANUFACTURING METHOD THEREOF

TECHNICAL FIELD

The present disclosure relates to a semiconductor structure, and a method of manufacturing the semiconductor structure. Particularly, the present disclosure relates to a semiconductor structure having a copper pillar within a solder bump, and a method of manufacturing the semiconductor structure including forming the copper pillar within the solder bump.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of the manufacturing process. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate having a pad disposed thereon and a passivation at least partially surrounding the pad; and a conductive bump structure disposed over the substrate and the pad, wherein the conductive bump structure includes a first bump portion disposed over the passivation and the pad, a conductive pillar disposed over the first bump portion, and a second bump portion disposed over and surrounding the conductive pillar.

In some embodiments, the conductive pillar is disposed between the first bump portion and the second bump portion.

In some embodiments, at least a portion of the first bump portion extends through the passivation.

In some embodiments, a height of the second bump portion is substantially greater than a height of the first bump portion.

In some embodiments, a width of the second bump portion is substantially greater than a width of the first bump portion.

In some embodiments, the conductive bump structure further comprises an interfacial layer surrounding the conductive pillar.

In some embodiments, the interfacial layer includes nitride.

In some embodiments, the conductive pillar is separated from the first bump portion and the second bump portion by the interfacial layer.

In some embodiments, the first bump portion is separated from the second bump portion by the interfacial layer.

In some embodiments, the interfacial layer includes a first layer disposed on the first bump portion and under the conductive pillar, and a second layer disposed on the first layer and covering the conductive pillar.

In some embodiments, the first layer and the second layer include a same material.

In some embodiments, the conductive bump structure further comprises a seed layer disposed over the passivation, on the pad and under the first bump portion.

Another aspect of the present disclosure provides a semiconductor structure. The semiconductor structure includes a first substrate having a first pad disposed thereon and a passivation at least partially surrounding the first pad; a conductive bump structure disposed over the first substrate and the first pad; and a second substrate having a second pad disposed thereon and bonded to the conductive bump structure, wherein the conductive bump structure includes a first bump portion disposed over the passivation and the pad, a conductive pillar disposed over the first bump portion, an interfacial layer disposed over the conductive pillar, and a second bump portion disposed over the interfacial layer and surrounding the interfacial layer and the conductive pillar.

In some embodiments, the second pad is in contact with and at least partially surrounded by the second bump portion.

In some embodiments, the interfacial layer is spaced apart from the second pad by the second bump portion.

In some embodiments, a width of the second bump portion is substantially greater than a width of the second pad.

In some embodiments, the conductive pillar is disposed between the first pad and the second pad.

In some embodiments, the second bump portion is softer than the conductive pillar.

In some embodiments, the first bump portion and the second bump portion include solder.

In some embodiments, the second substrate is disposed above the first substrate.

Another aspect of the present disclosure provides a method of manufacturing a semiconductor structure. The method includes steps of providing a first substrate having a first pad disposed thereon and a passivation at least partially surrounding the first pad; forming a patterned mask over the passivation; forming a first bump portion over the passivation and the first pad and surrounded by the patterned mask; forming a first layer of an interfacial layer over the first bump portion and surrounded by the patterned mask; forming a conductive pillar on the first layer of the interfacial layer; forming a second layer of the interfacial layer on the first layer and covering the conductive pillar; forming a second bump portion over the second layer of the interfacial layer and surrounded by the patterned mask; and removing the patterned mask.

In some embodiments, the patterned mask includes oxide.

In some embodiments, the formation of the patterned mask includes disposing a mask layer over the passivation and the first pad, disposing a first photoresist layer partially covering the mask layer, and removing a portion of the mask layer exposed through the first photoresist layer to form a first opening extending through the mask layer.

In some embodiments, the method further comprises laterally removing the mask layer by wet etching to widen the first opening to form a second opening after the formation of the first opening.

In some embodiments, a width of the second opening is substantially greater than a width of the first opening.

In some embodiments, a sidewall of the second opening is outwardly curved.

In some embodiments, the first bump portion, the first layer of the interfacial layer, the conductive pillar, the second layer of the interfacial layer and the second bump portion are formed within the second opening.

In some embodiments, the formation of the conductive pillar includes disposing a second photoresist layer over the patterned mask and the first layer of the interfacial layer and within the second opening, removing a portion of the second photoresist layer to form a third opening, disposing a conductive material within the third opening to form the conductive pillar, and removing the second photoresist layer.

In some embodiments, the conductive material is disposed on the first layer of the interfacial layer.

In some embodiments, the conductive material is disposed by electroplating.

In some embodiments, the method further comprises providing a second substrate having a second pad disposed thereon; and bonding the second pad with the second bump portion.

In some embodiments, a bonding force is applied to press the second substrate toward the second bump portion during the bonding.

In some embodiments, the second pad is pressed toward the second bump portion during the bonding.

In some embodiments, the second pad is in contact with the second bump portion after the bonding.

In some embodiments, the second bump portion is deformable during the bonding.

In conclusion, because a conductive pillar is disposed within a conductive bump structure, an overall strength of the conductive bump structure is increased or improved. Further, a large bonding force on the conductive bump structure is generated during a bonding of a die over a substrate. As such, the conductive bump structure with the improved strength can withstand a large bonding force with minimum deformation. Therefore, bridging between the adjacent conductive bumps can be prevented. A reliability of a semiconductor structure having such strengthened conductive bump structure is increased or improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
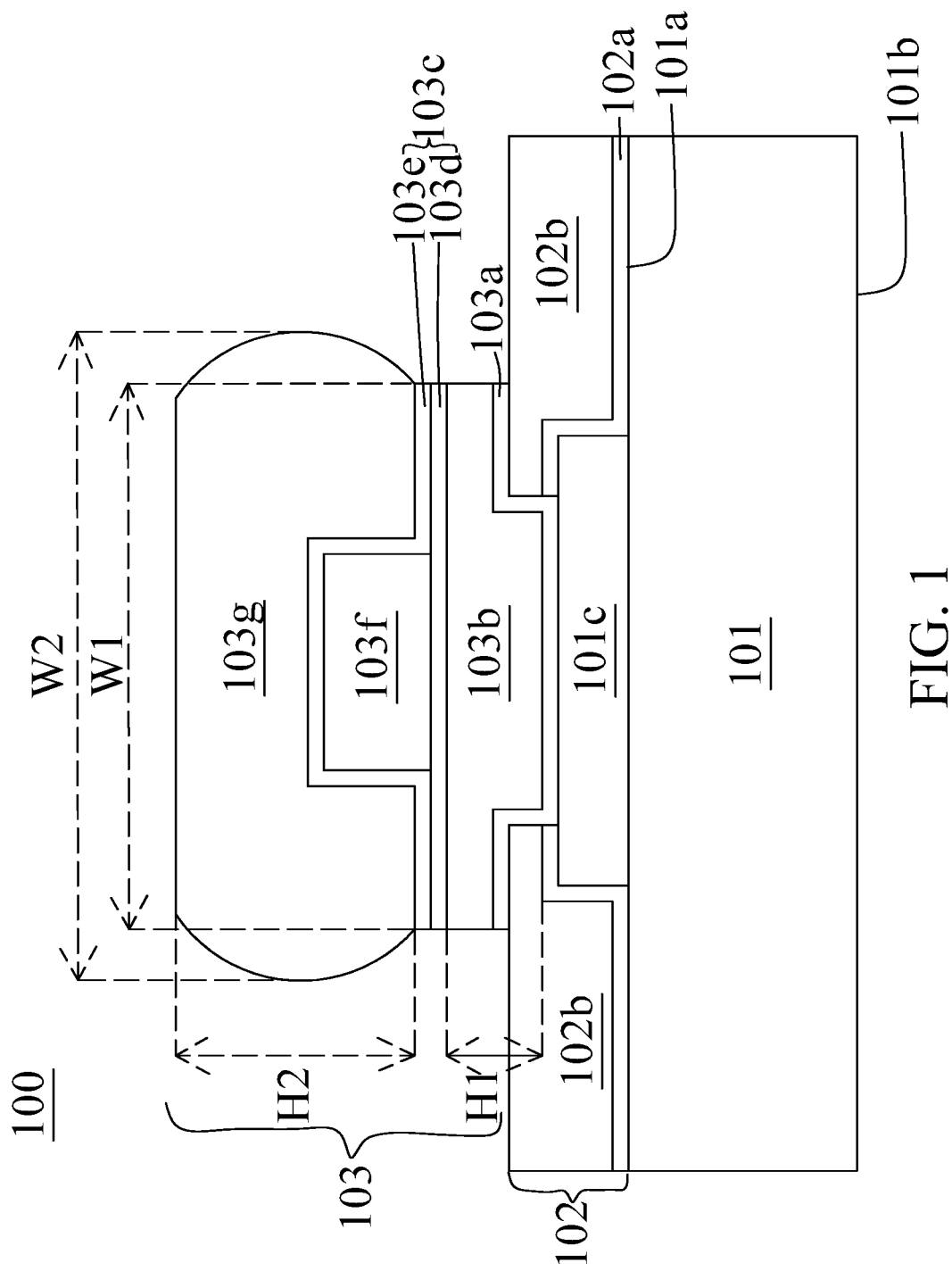
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

In the present application, a semiconductor structure having a copper pillar within a solder bump, and a manufacturing method of the semiconductor structure are provided. The semiconductor structure includes a substrate having a pad disposed thereon and a passivation at least partially surrounding the pad; and a conductive bump structure disposed over the passivation and the pad, wherein the conductive bump structure includes a first bump portion disposed over the passivation and the pad, a conductive pillar disposed over the first bump portion, and a second bump portion disposed over and surrounding the conductive pillar.

FIG. 1 is a schematic cross-sectional view of a first semiconductor structure 100 in accordance with some embodiments of the present disclosure. In some embodiments, the first semiconductor structure 100 is a part of a package or a device. In some embodiments, the first semiconductor structure 100 includes a die. In some embodiments, the first semiconductor structure 100 includes a first substrate 101, a passivation 102 disposed over the first substrate 101, and a conductive bump structure 103 disposed over the first substrate 101 and the passivation 102.

In some embodiments, the first substrate 101 is a semiconductive layer. In some embodiments, the first substrate 101 includes semiconductive material such as silicon, germanium, gallium, arsenic, or a combination thereof. In some embodiments, the first substrate 101 is a silicon substrate. In some embodiments, the first substrate 101 includes a dielectric layer thereon. In some embodiments, the first substrate 101 includes silicon dioxide or the like. In some embodiments, a top surface of the first substrate 101 has a rectangular or circular shape or any other suitable shape.

In some embodiments, the first substrate 101 includes various features formed therein or thereover. In some embodiments, the first substrate 101 includes a variety of electrical circuits suitable for a particular application. In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the first substrate 101 and configured to electrically connect to an external circuitry.

In some embodiments, the first substrate 101 is defined with a first surface 101a and a second surface 101b opposite to the first surface 101a. In some embodiments, the first surface 101a is a front side of the first substrate 101, and the second surface 101b is a back side of the first substrate 101. In some embodiments, various features are formed in or over the first surface 101a of the first substrate 101.

In some embodiments, a first pad 101c is disposed on the first substrate 101. In some embodiments, the first pad 101c is disposed on the first surface 101a of the first substrate 101. In some embodiments, the first pad 101c is configured to connect the component or circuitry of the first substrate 101 to an external interconnection. In some embodiments, the first pad 101c includes conductive material such as gold, silver, copper, nickel, tungsten, aluminum, tin, alloys thereof or the like. In some embodiments, the first pad 101c is an aluminum (Al) pad. In some embodiments, a top surface of the first pad 101c has a circular or polygonal shape.

In some embodiments, the passivation 102 is disposed over the first substrate 101 and at least partially surrounds the first pad 101c. In some embodiments, the passivation 102 partially covers the first pad 101c, such that the first pad 101c is partially exposed through the passivation 102. In some embodiments, the passivation 102 is disposed on the first surface 101a of the first substrate 101. In some embodiments, the passivation 102 includes dielectric materials, such as spin-on glass (SOG), silicon oxide, silicon oxynitride, silicon nitride or the like. In some embodiments, the passivation 102 includes polymer, BCB, PBO, PI or the like.

In some embodiments, the passivation 102 includes several layers stacked over each other. In some embodiments, the passivation 102 includes a first passivation layer 102a and a second passivation layer 102b disposed over the first passivation layer 102a. In some embodiments, the first passivation layer 102a is disposed over the first surface 101a of the first substrate 101 and partially covers the first pad 101c. In some embodiments, the first passivation layer 102a includes dielectric material, such as oxide or the like.

In some embodiments, the second passivation layer 102b is disposed over the first passivation layer 102a and partially covers the first pad 101c. In some embodiments, the second passivation layer 102b includes dielectric material, such as nitride or the like. In some embodiments, a thickness of the first passivation layer 102a is substantially less than a thickness of the second passivation layer 102b. In some embodiments, the first passivation layer 102a and the second passivation layer 102b include a same material or different materials.

In some embodiments, the conductive bump structure 103 is disposed over the first substrate 101, the passivation 102 and the first pad 101c. In some embodiments, the conductive bump structure 103 protrudes from the first pad 101c and the passivation 102. In some embodiments, the conductive bump structure 103 is configured to connect the first substrate 101 and the first pad 101c to an external electrical component or interconnection.

In some embodiments, the conductive bump structure 103 includes a seed layer 103a disposed on the first pad 101c and the passivation 102. In some embodiments, the seed layer 103a is in contact with the first pad 101c and the second passivation layer 102b. In some embodiments, the seed layer 103a is a single layer or a composite stack and is formed with material such as copper, titanium, tungsten, tantalum, titanium/copper, or a combination thereof. In some embodiments, the seed layer 103a includes a titanium layer and a copper layer.

In some embodiments, the conductive bump structure 103 includes a first bump portion 103b disposed over the seed layer 103a. In some embodiments, the first bump portion 103b is disposed over the passivation 102 and the first pad 101c. In some embodiments, the first bump portion 103b is in contact with the seed layer 103a. In some embodiments, the first bump portion 103b extends through the passivation 102 toward the first pad 101c. In some embodiments, the first bump portion 103b includes low-temperature reflowable material. In some embodiments, the first bump portion 103b includes soldering material such as tin, lead, silver, copper, nickel, bismuth, or a combination thereof. In some embodiments, the first bump portion 103b includes alloy of tin and silver.

In some embodiments, the conductive bump structure 103 includes a conductive pillar 103f disposed over the first substrate 101, the first pad 101c, the seed layer 103a and the first bump portion 103b. In some embodiments, the conductive pillar 103f includes conductive material such as gold, silver, copper, nickel, tungsten, aluminum, tin, alloys thereof or the like.

In some embodiments, the first bump portion 103b is substantially softer than the conductive pillar 103f. In some embodiments, a Young's modulus of the conductive pillar 103f is substantially greater than a Young's modulus of the first bump portion 103b. In some embodiments, a top surface of the conductive pillar 103f has a circular or polygonal shape. In some embodiments, the conductive pillar 103f has a cylindrical shape. In some embodiments, the conductive pillar 103f is a copper pillar.

In some embodiments, the conductive bump structure 103 includes an interfacial layer 103c surrounding the conductive pillar 103f. In some embodiments, the interfacial layer 103c encloses the entire conductive pillar 103f. In some embodiments, the interfacial layer 103c is disposed on the first bump portion 103b. In some embodiments, the conductive pillar 103f is separated from the first bump portion 103b by the interfacial layer 103c. In some embodiments, the interfacial layer 103c includes dielectric material such as nitride or the like.

In some embodiments, the interfacial layer 103c includes a first layer 103d and a second layer 103e over the first layer 103d. In some embodiments, the first layer 103d is disposed on the first bump portion 103b and under the conductive pillar 103f. In some embodiments, the second layer 103e is disposed on the first layer 103d and covers the conductive pillar 103f.

In some embodiments, the second layer 103e is conformal to the first layer 103d and the conductive pillar 103f. In some embodiments, the conductive pillar 103f is disposed on the first layer 103d. In some embodiments, the first layer 103d and the second layer 103e include a same material. In some embodiments, the first layer 103d and the second layer 103e include nitride or the like.

In some embodiments, the conductive bump structure 103 includes a second bump portion 103g disposed over the conductive pillar 103f and surrounding the conductive pillar 103f. In some embodiments, the second bump portion 103g is conformal to the second layer 103e of the interfacial layer 103c and surrounds the conductive pillar 103f. In some embodiments, a sidewall of the second bump portion 103g is a convex surface protruding out of the second bump portion 103g.

In some embodiments, the conductive pillar 103f is disposed between the first bump portion 103b and the second bump portion 103g. In some embodiments, the conductive pillar 103f is separated from the second bump portion 103g by the interfacial layer 103c. In some embodiments, the first bump portion 103b is separated from the second bump portion 103g by the interfacial layer 103c.

In some embodiments, the second bump portion 103g is configured to bond to an external interconnect. In some embodiments, the second bump portion 103g includes low-temperature reflowable material. In some embodiments, the second bump portion 103g includes soldering material such as tin, lead, silver, copper, nickel, bismuth, or a combination thereof. In some embodiments, the second bump portion 103g includes alloy of tin and silver. In some embodiments, the first bump portion 103b and the second bump portion 103g include a same material.

In some embodiments, a height H2 of the second bump portion 103g is substantially greater than a height H1 of the first bump portion 103b. In some embodiments, a width W2 of the second bump portion 103g is substantially greater than a width W1 of the first bump portion 103b. In some embodiments, a width of the conductive pillar 103f is substantially less than the width W2 of the second bump portion 103g.

Figure 2:
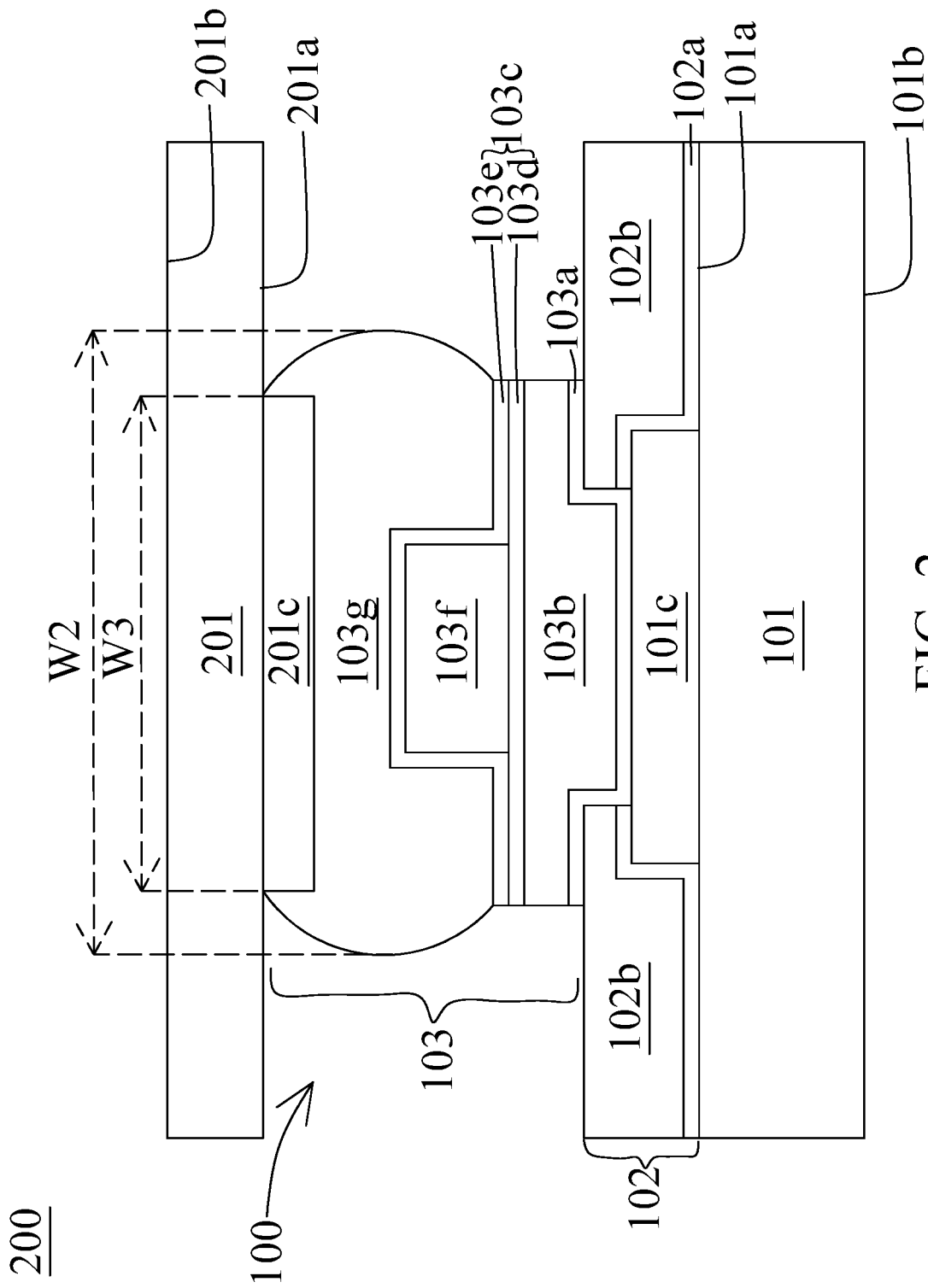
FIG. 2 is a cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 is a bonded structure. In some embodiments, the second semiconductor structure 200 includes the first semiconductor structure 100 illustrated in FIG. 1 and discussed above.

In some embodiments, the second semiconductor structure 200 is a part of a package or a device. In some embodiments, the second semiconductor structure 200 includes a second substrate 201 and a second pad 201c disposed on the second substrate 201. In some embodiments, the second substrate 201 and the second pad 201c are disposed above the first semiconductor structure 100. In some embodiments, the second substrate 201 is disposed above the first substrate 101.

In some embodiments, the second substrate 201 is a die substrate. In some embodiments, the second substrate 201 includes a semiconductive layer. In some embodiments, the second substrate 201 includes semiconductive material such as silicon, germanium, gallium, arsenic, or a combination thereof. In some embodiments, the second substrate 201 is a silicon substrate. In some embodiments, a top surface of the second substrate 201 has a rectangular shape or any other suitable shape.

In some embodiments, the second substrate 201 is defined with a third surface 201a and a fourth surface 201b opposite to the third surface 201a. In some embodiments, the third surface 201a is a front side of the second substrate 201, and the fourth surface 201b is a back side of the second substrate 201. In some embodiments, various features are formed in or over the third surface 201a of the second substrate 201.

In some embodiments, the second pad 201c is disposed on the second substrate 201. In some embodiments, the second pad 201c is disposed on the third surface 201a of the second substrate 201. In some embodiments, the second pad 201c is configured to connect the component or circuitry of the second substrate 201 to an external interconnection. In some embodiments, the second pad 201c includes conductive material such as gold, silver, copper, nickel, tungsten, aluminum, tin, alloys thereof or the like. In some embodiments, the second pad 201c is an aluminum pad. In some embodiments, a top surface of the second pad 201c has a circular or polygonal shape.

In some embodiments, the second pad 201c protrudes from the third surface 201a of the second substrate 201. In some embodiments, the second pad 201c is bonded to the conductive bump structure 103 of the first semiconductor structure 100. In some embodiments, the second pad 201c is in contact with the second bump portion 103g. In some embodiments, the second pad 201c protrudes into the second bump portion 103g and is at least partially surrounded by the second bump portion 103g.

In some embodiments, the interfacial layer 103c of the first semiconductor structure 100 is spaced apart from the second pad 201c by the second bump portion 103g. In some embodiments, the conductive pillar 103f is disposed between the first pad 101c and the second pad 201c. In some embodiments, the conductive pillar 103f is spaced apart from the second pad 201c by the second layer 103e of the interfacial layer 103c and the second bump portion 103g. In some embodiments, the width W2 of the second bump portion 103g is substantially greater than a width of the second pad 201c.

Figure 3:
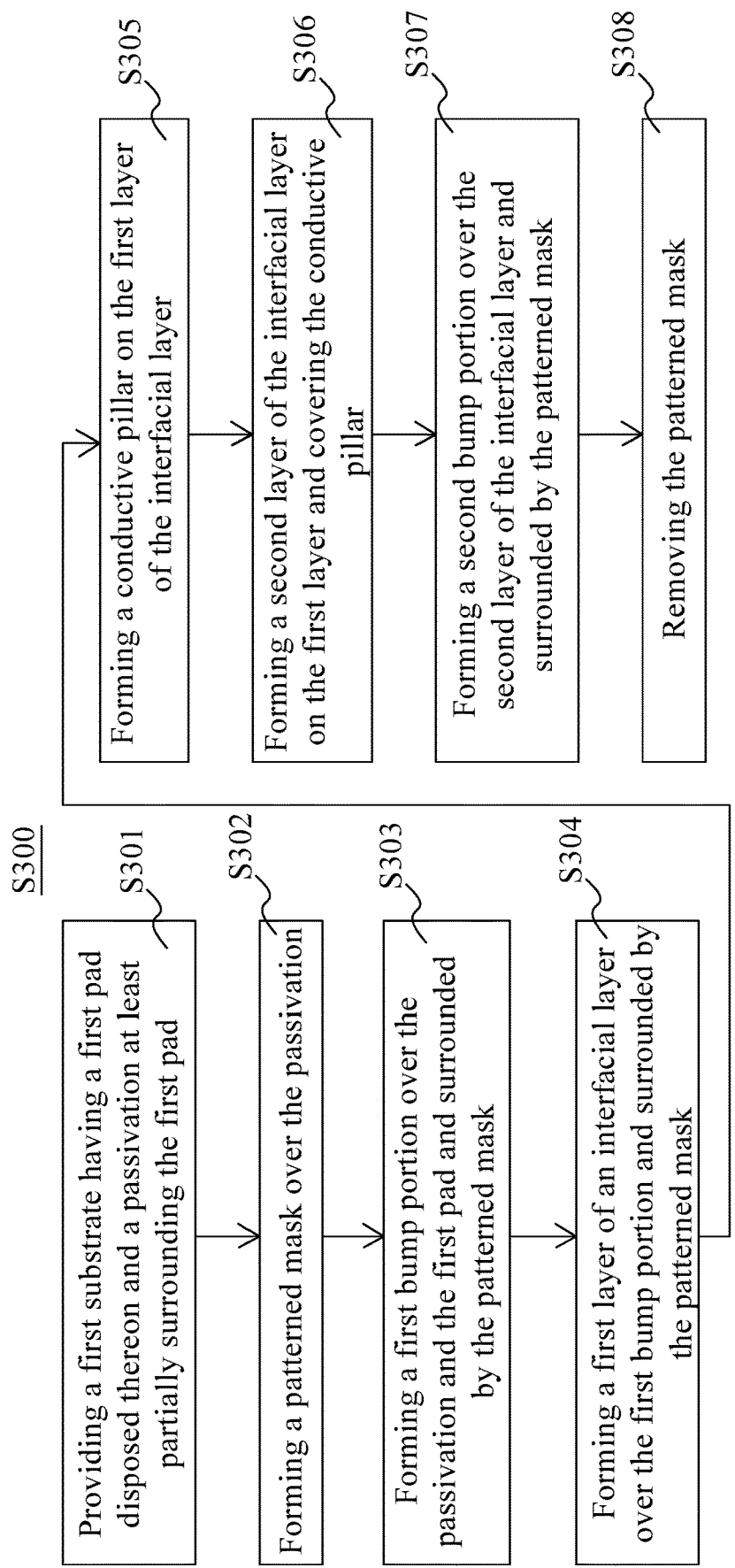
FIG. 3 is flow diagram illustrating a method of manufacturing a first or a second semiconductor structure in accordance with some embodiments of the present disclosure.

In the present application, a manufacturing method of the semiconductor structure having the copper pillar within the solder bump is also provided. FIG. 3 is a flow diagram illustrating a method S300 of manufacturing the first semiconductor structure 100 or the second semiconductor structure 200 in accordance with some embodiments of the present disclosure, and FIGS. 4 to 32 are cross-sectional views of intermediate stages in the formation of the first semiconductor structure 100 or the second semiconductor structure 200 in accordance with some embodiments of the present disclosure.

The stages shown in FIGS. 4 to 32 are also illustrated schematically in the flow diagram in FIG. 3. In the following discussion, the fabrication stages shown in FIGS. 4 to 32 are discussed in reference to the process steps shown in FIG. 3. The method S300 includes a number of operations and the description and illustration are not deemed as a limitation as the sequence of the operations.

The method S300 includes a number of steps (S301, S302, S303, S304, S305, S306, S307 and S308). The method S300 includes providing a first substrate having a first pad disposed thereon and a passivation at least partially surrounding the first pad (S301); forming a patterned mask over the passivation (S302); forming a first bump portion over the passivation and the first pad and surrounded by the patterned mask (S303); forming a first layer of an interfacial layer over the first bump portion and surrounded by the patterned mask (S304); forming a conductive pillar on the first layer of the interfacial layer (S305); forming a second layer of the interfacial layer on the first layer and covering the conductive pillar (S306); forming a second bump portion over the second layer of the interfacial layer, wherein the second bump portion is surrounded by the patterned mask (S307); and removing the patterned mask (S308).

Figure 4:
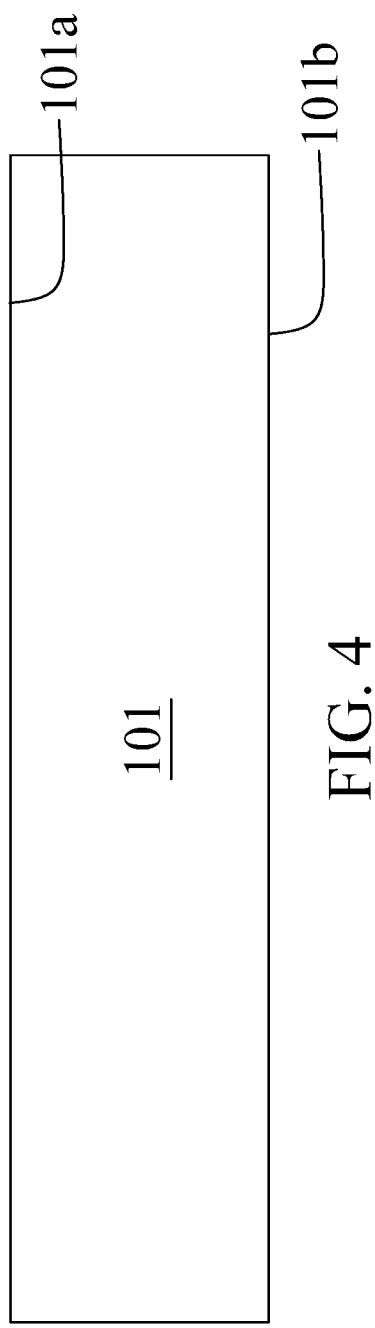
FIGS. 4 through 32 are cross-sectional views of intermediate stages in formation of a first or a second semiconductor structure in accordance with some embodiments of the present disclosure.

Referring to FIGS. 4 to 13, a first substrate 101 having a first pad 101c disposed thereon and a passivation 102 at least partially surrounding the first pad 101c is provided according to step S301 in FIG. 3. In some embodiments, the first substrate 101 is provided as shown in FIG. 4. In some embodiments, the first substrate 101 includes semiconductive material such as silicon, germanium, gallium, arsenic, or a combination thereof. In some embodiments, the first substrate 101 is a silicon substrate. In some embodiments, the first substrate 101 includes a dielectric layer thereon. In some embodiments, the first substrate 101 includes silicon dioxide or the like.

In some embodiments, the first substrate 101 is defined with a first surface 101a and a second surface 101b opposite to the first surface 101a. In some embodiments, the first surface 101a is a front side of the first substrate 101, and the second surface 101b is a back side of the first substrate 101. In some embodiments, various features are formed in or over the first surface 101a of the first substrate 101. In some embodiments, the first substrate 101 has a configuration similar to that of the first substrate 101 illustrated in FIG. 1 or 2 and discussed above.

Figure 5:
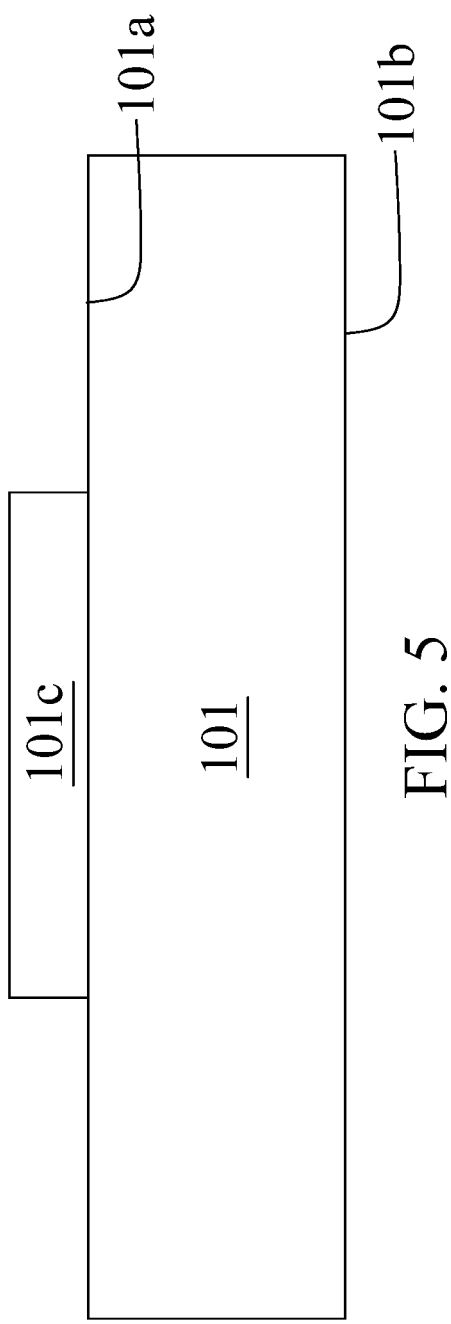

In some embodiments, the first pad 101c is formed on the first substrate 101 as shown in FIG. 5. In some embodiments, the first pad 101c is formed on the first surface 101a of the first substrate 101 by deposition or any other suitable process. In some embodiments, the first pad 101c is configured to connect the component or circuitry of the first substrate 101 to an external interconnection. In some embodiments, the first pad 101c includes conductive material such as gold, silver, copper, nickel, tungsten, aluminum, tin, alloys thereof or the like. In some embodiments, the first pad 101c is an aluminum (Al) pad. In some embodiments, the first pad 101c has a configuration similar to that of the first pad 101c in FIG. 1 or 2 and discussed above.

Figure 6:
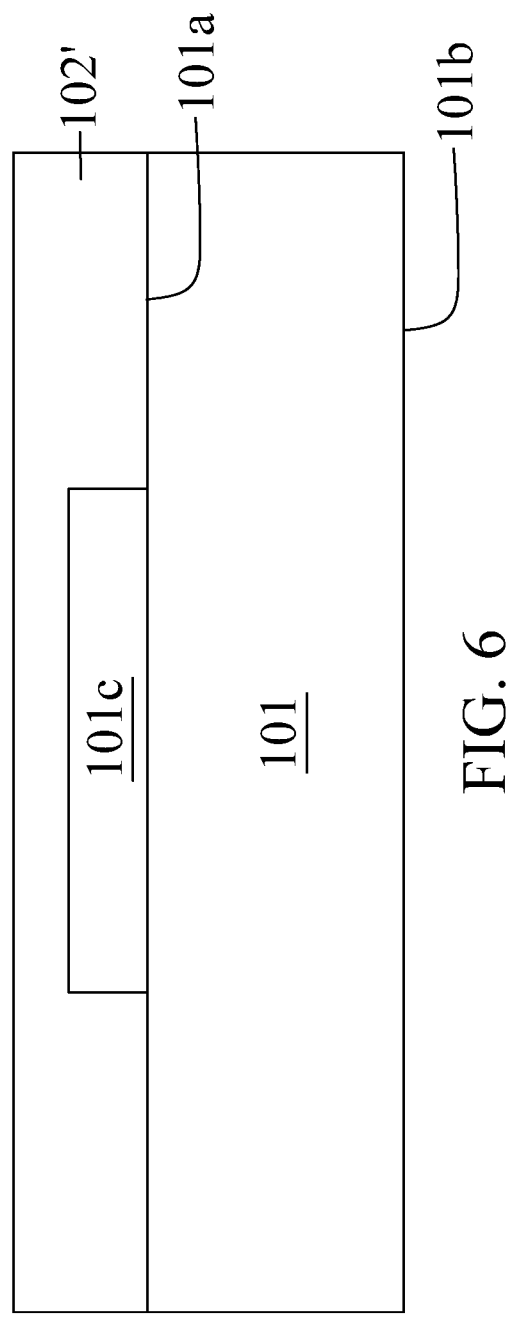
Figure 7:
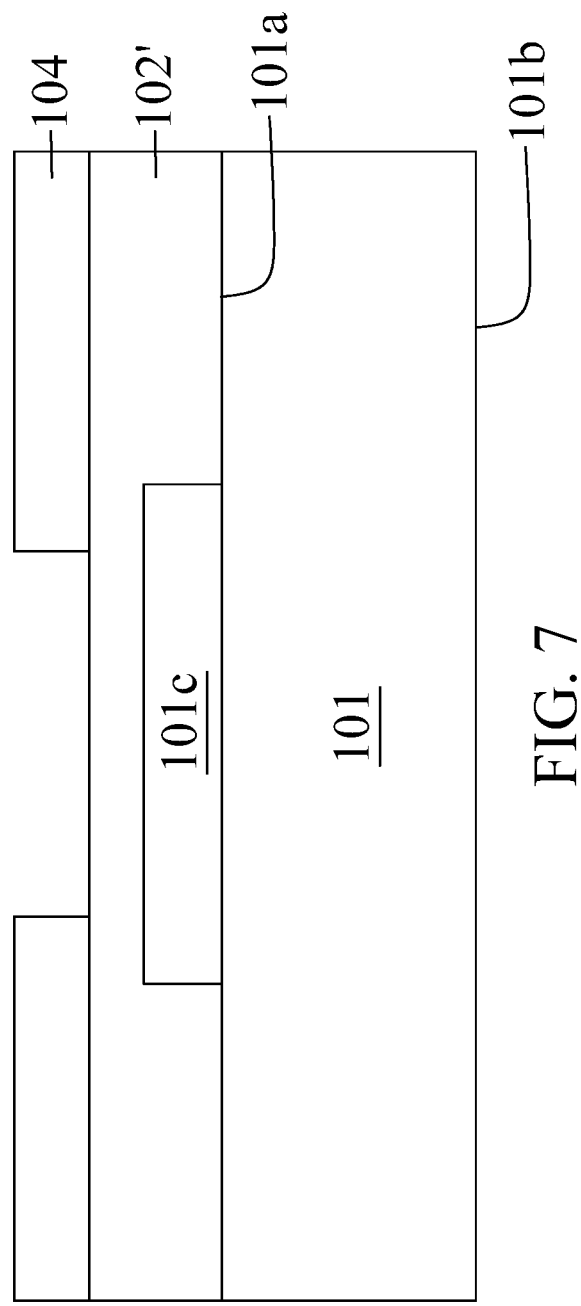
Figure 8:
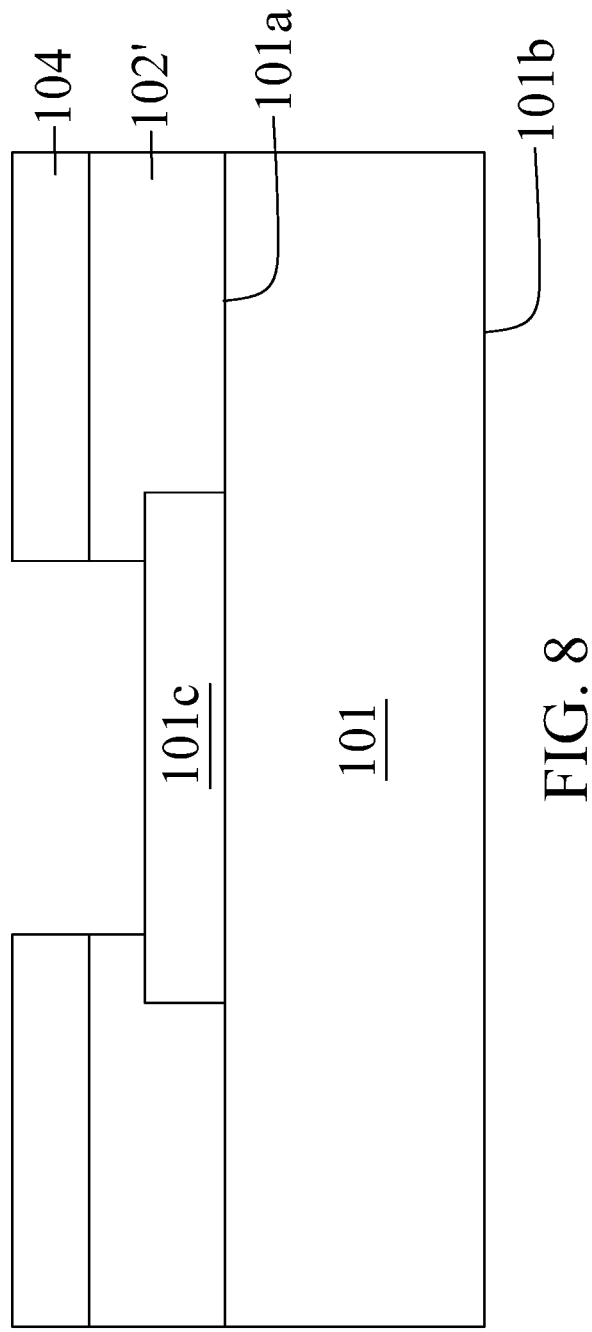
Figure 9:
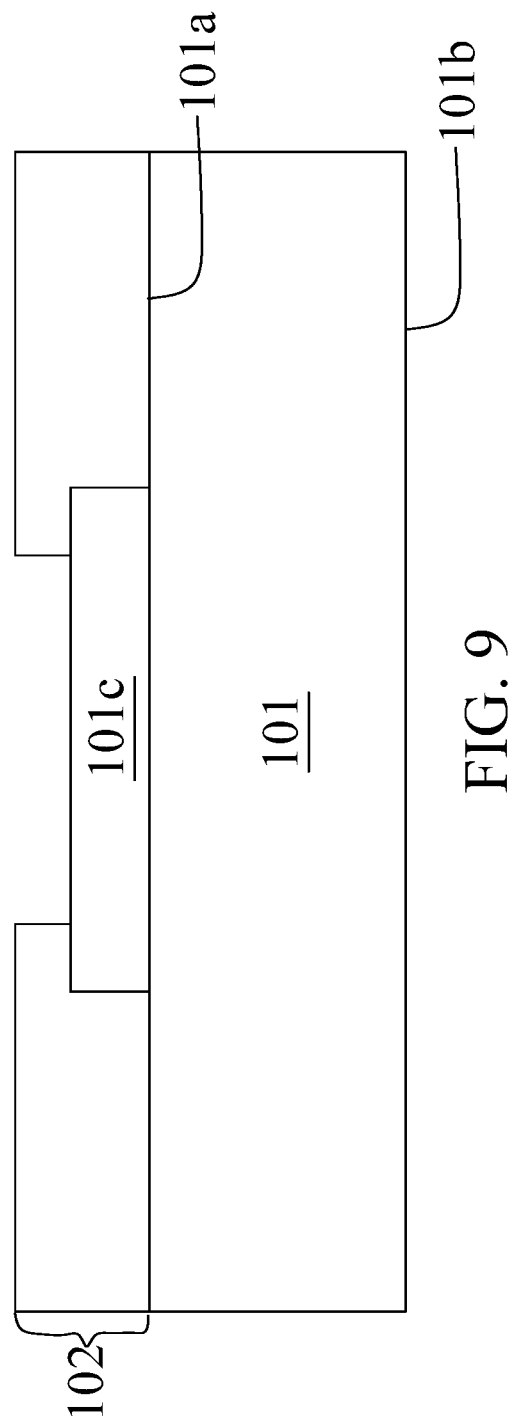

In some embodiments, the passivation 102 is formed over the first substrate 101 and partially covers the first pad 101c as shown in FIGS. 6 to 9. In some embodiments, the formation of the passivation 102 includes disposing a passivation material 102' over the first substrate 101 and covering the first pad 101c as shown in FIG. 6, forming a first photoresist layer 104 partially covering the passivation material 102', removing a portion of the passivation material 102' exposed through the first photoresist layer 104 to form the passivation 102 as shown in FIG. 8, and then removing the first photoresist layer 104 as shown in FIG. 9.

In some embodiments, the passivation material 102' is disposed by deposition, chemical vapor deposition (CVD) or any other suitable process. In some embodiments, the portion of the passivation material 102' exposed through the first photoresist layer 104 is removed by etching or any other suitable process. In some embodiments, at least a portion of the first pad 101c is exposed through the passivation 102. In some embodiments, the passivation 102 includes dielectric materials, such as spin-on glass (SOG), silicon oxide, silicon oxynitride, silicon nitride or the like. In some embodiments, the passivation 102 includes polymer, BCB, PBO, PI or the like.

Figure 10:
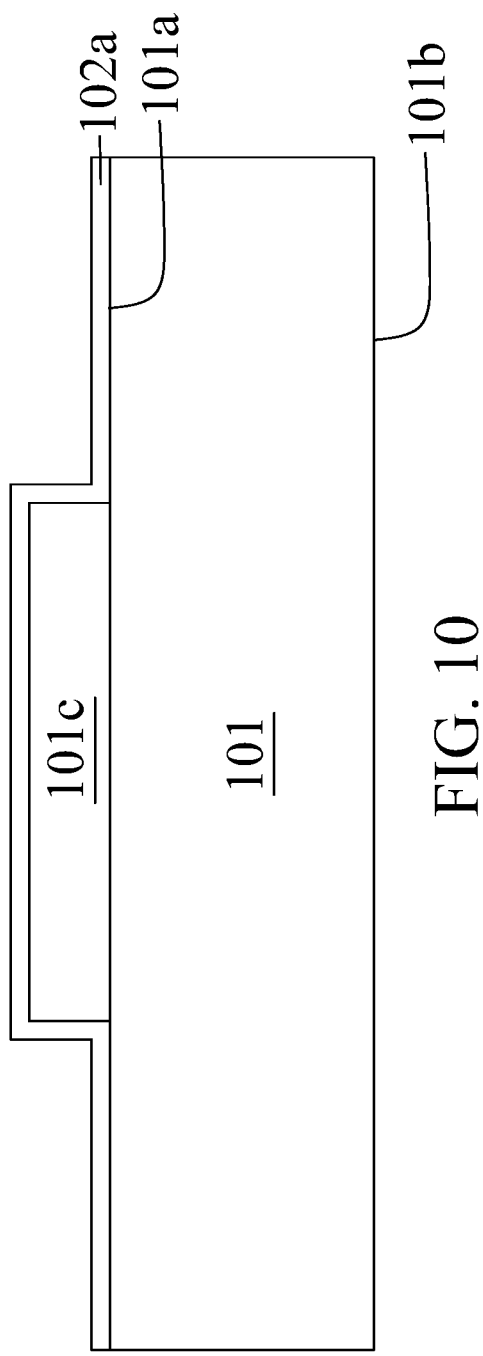
Figure 11:
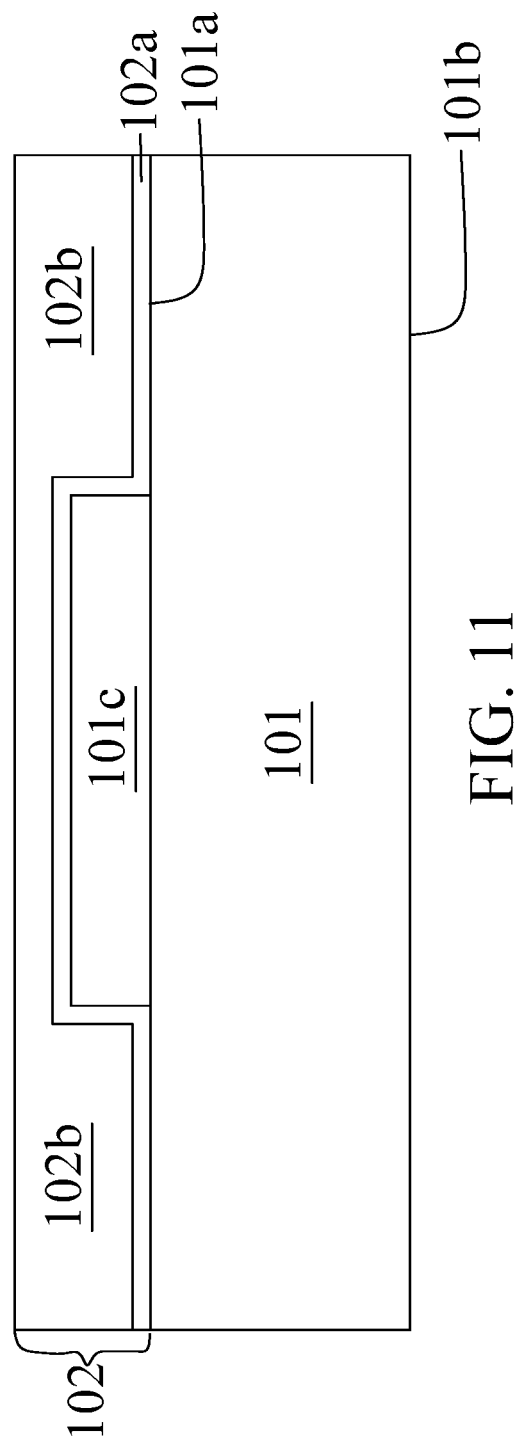
Figure 12:
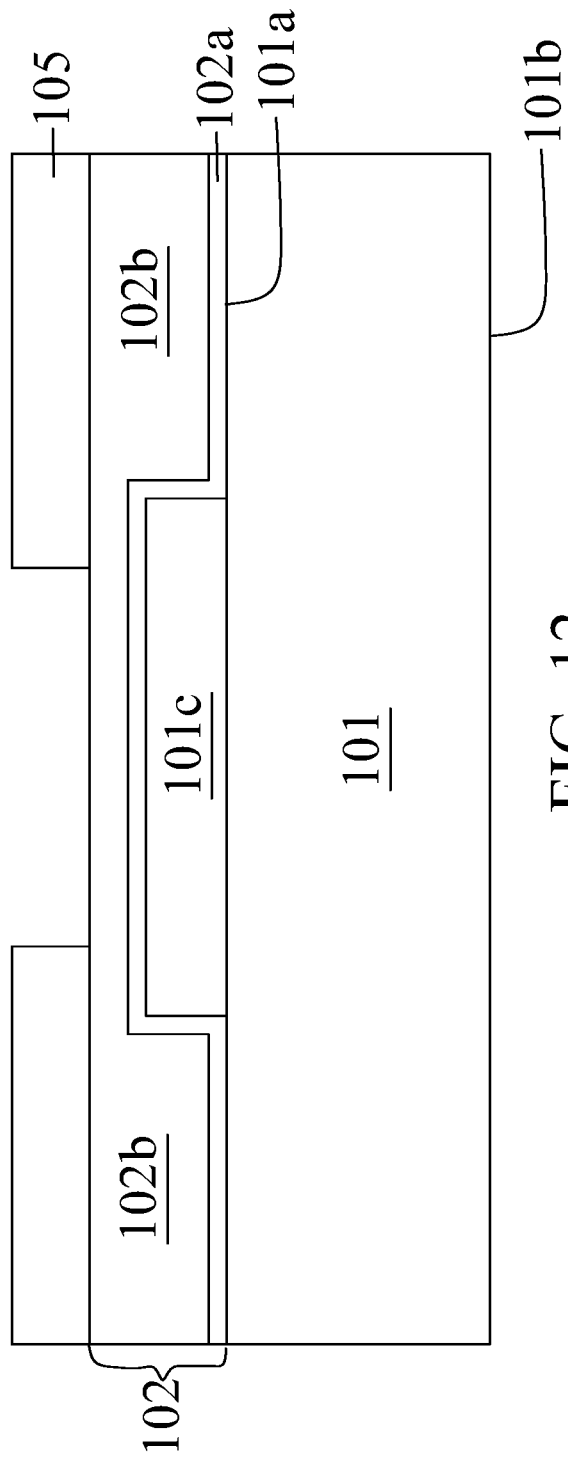
Figure 13:
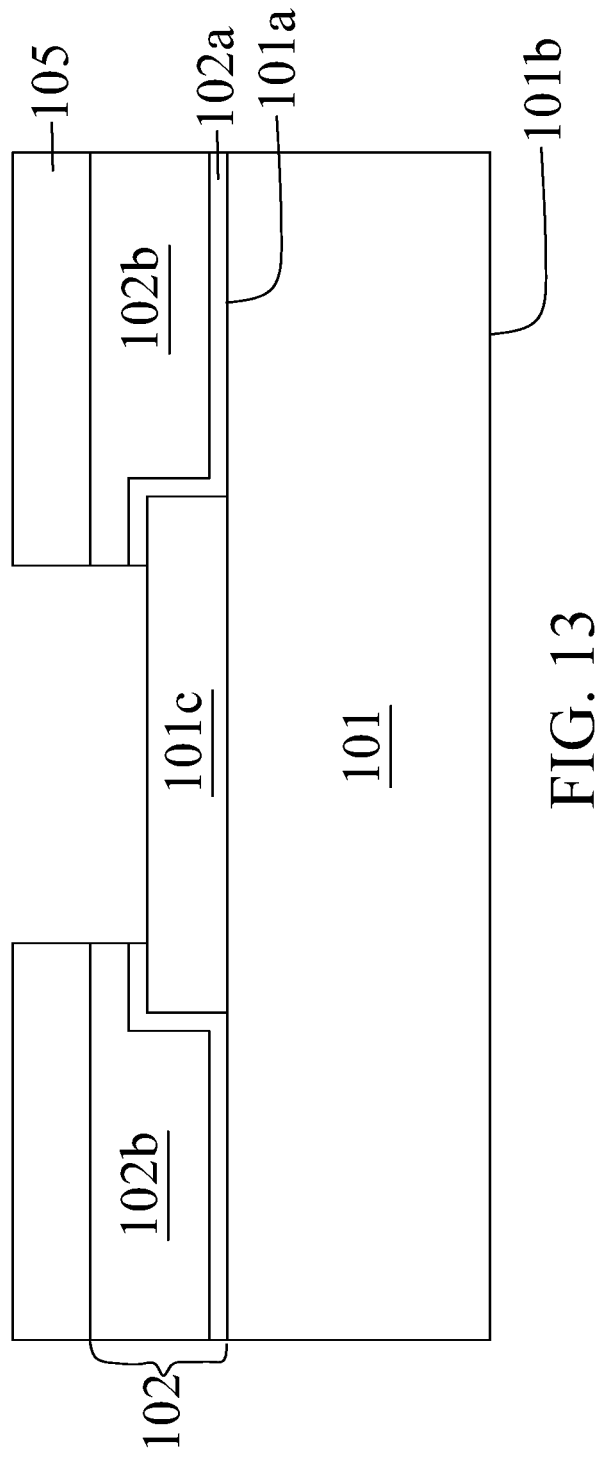
Figure 14:
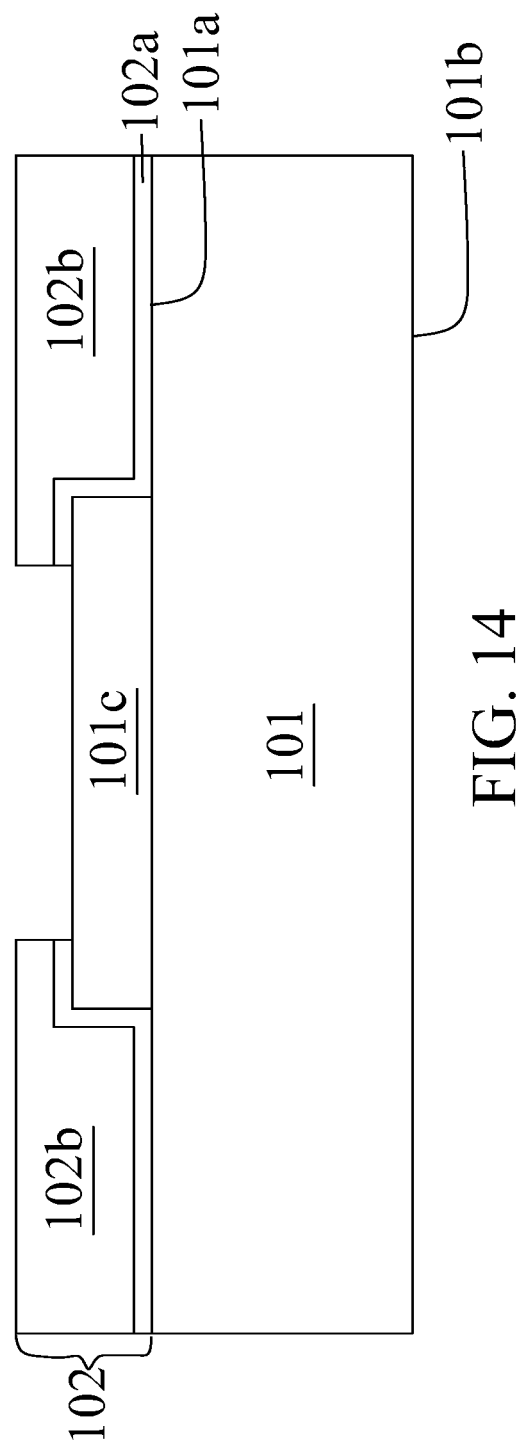

Alternatively, the passivation 102 is formed over the first substrate 101 and partially covers the first pad 101c as shown in FIGS. 10 to 14. In some embodiments, the formation of the passivation 102 includes disposing a first passivation layer 102a over the first substrate 101 and covering the first pad 101c as shown in FIG. 10, disposing a second passivation layer 102b over the first passivation layer 102a as shown in FIG. 11, forming a second photoresist layer 105 over the second passivation layer 102b as shown in FIG. 12, removing a portion of the first passivation layer 102a and a portion of the second passivation layer 102b exposed through the second photoresist layer 105 to form the passivation 102 as shown in FIG. 13, and then removing the second photoresist layer 105 as shown in FIG. 14.

In some embodiments, the first passivation layer 102a and the second passivation layer 102b are disposed by deposition or any other suitable process. In some embodiments, the portion of the first passivation layer 102a and the portion of the second passivation layer 102b exposed through the second photoresist layer 105 are removed by etching or any other suitable process. In some embodiments, at least a portion of the first pad 101c is exposed through the passivation 102.

In some embodiments, the first passivation layer 102a includes dielectric material, such as oxide or the like. In some embodiments, the second passivation layer 102b includes dielectric material, such as nitride or the like. In some embodiments, the first passivation layer 102a and the second passivation layer 102b include a same material or different materials. In some embodiments, the passivation 102, the first passivation layer 102a and the second passivation layer 102b have configurations similar to those of the passivation 102, the first passivation layer 102a and the second passivation layer 102b in FIG. 1 or 2 and discussed above.

Figure 15:
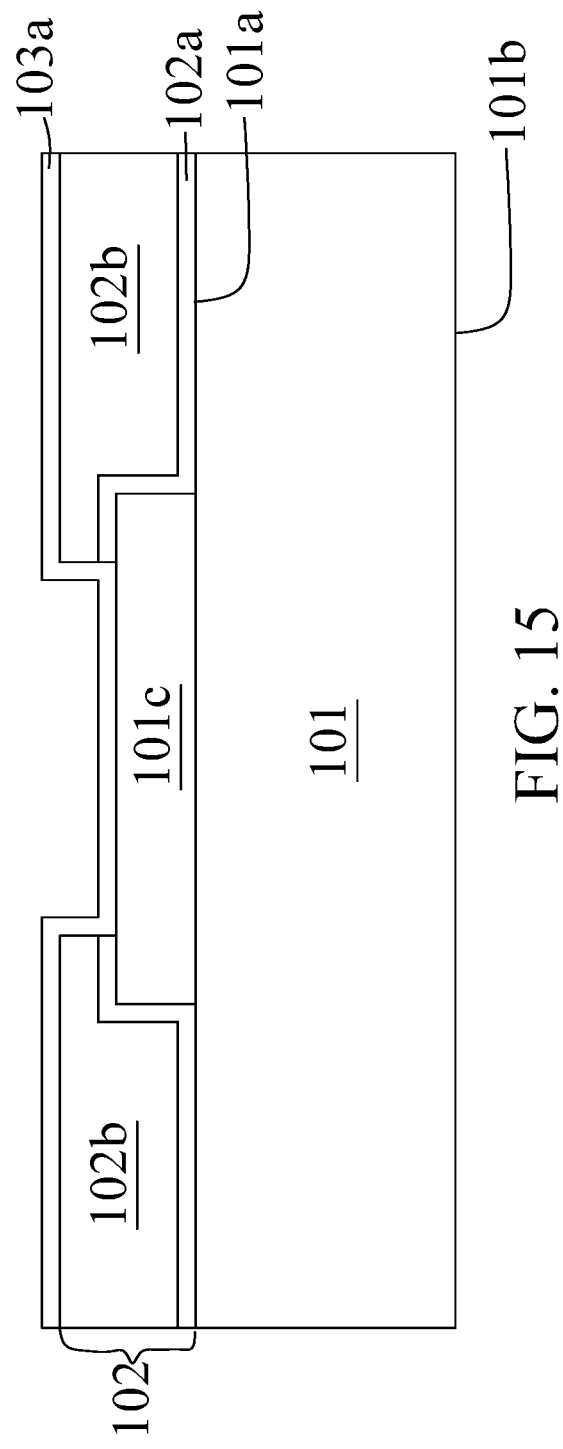

In some embodiments, after the step S301, a seed layer 103a is formed over the passivation 102 and the first pad 101c as shown in FIG. 15. In some embodiments, the seed layer 103a is formed by sputtering, physical vapor deposition (PVD) or any other suitable process. In some embodiments, the seed layer 103a is a single layer or a composite stack and formed with material such as copper, titanium, tungsten, tantalum, titanium/copper, or a combination thereof.

In some embodiments, the seed layer 103a is formed by disposing a titanium layer and then disposing a copper layer on the titanium layer. In some embodiments, the seed layer 103a is in contact with the first pad 101c exposed through the passivation 102. In some embodiments, the seed layer 103a has a configuration similar to that of the seed layer 103a illustrated in FIG. 1 or 2 and discussed above.

In some embodiments, prior to the disposing of the seed layer 103a, a diffusion barrier layer is disposed conformal to a sidewall of the passivation 102. In some embodiments, the diffusion barrier layer is disposed by ALD, CVD or the like. In some embodiments, the diffusion barrier layer includes titanium, titanium nitride, tantalum, tantalum nitride, nickel or the like.

Figure 16:
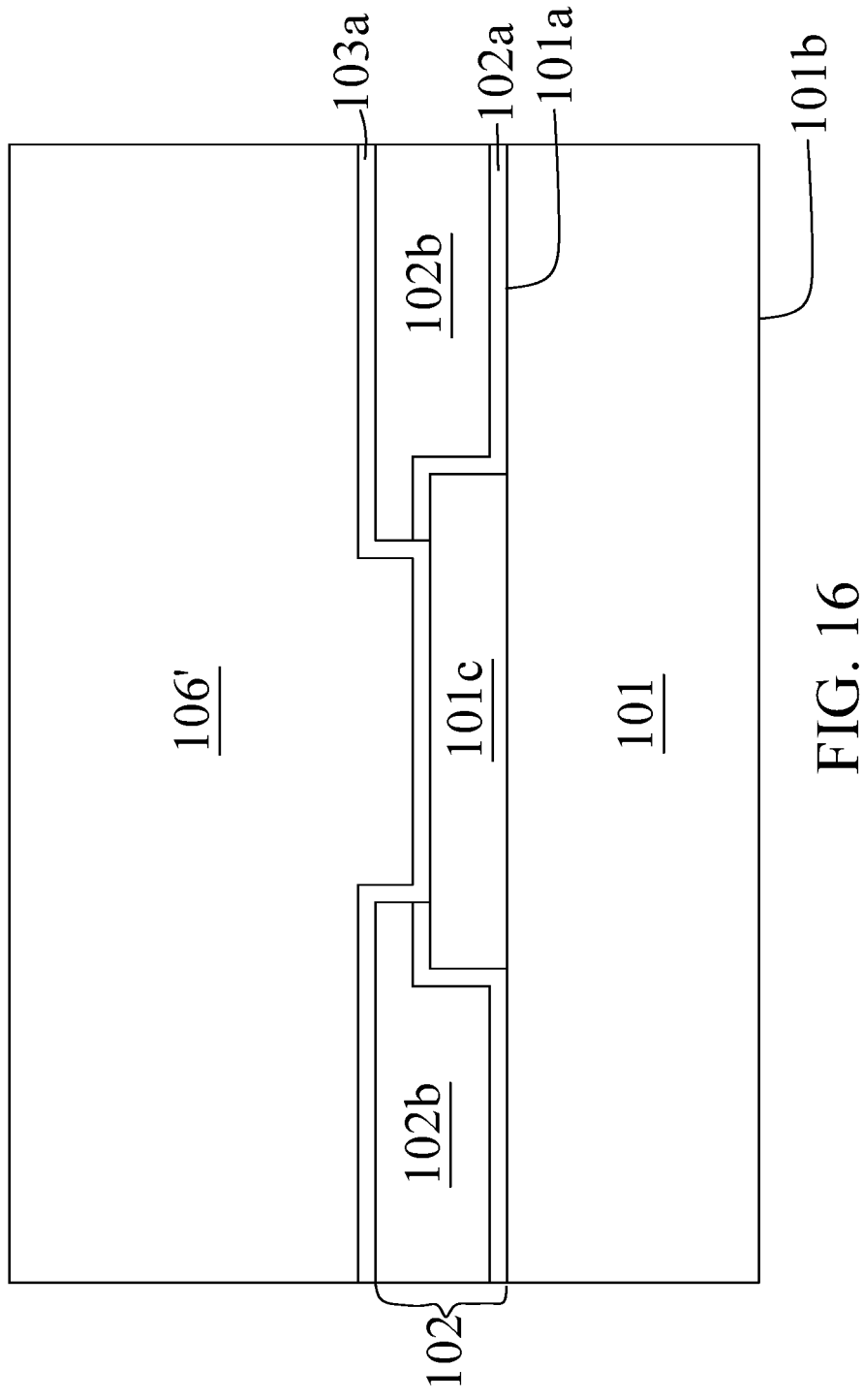
Figure 17:
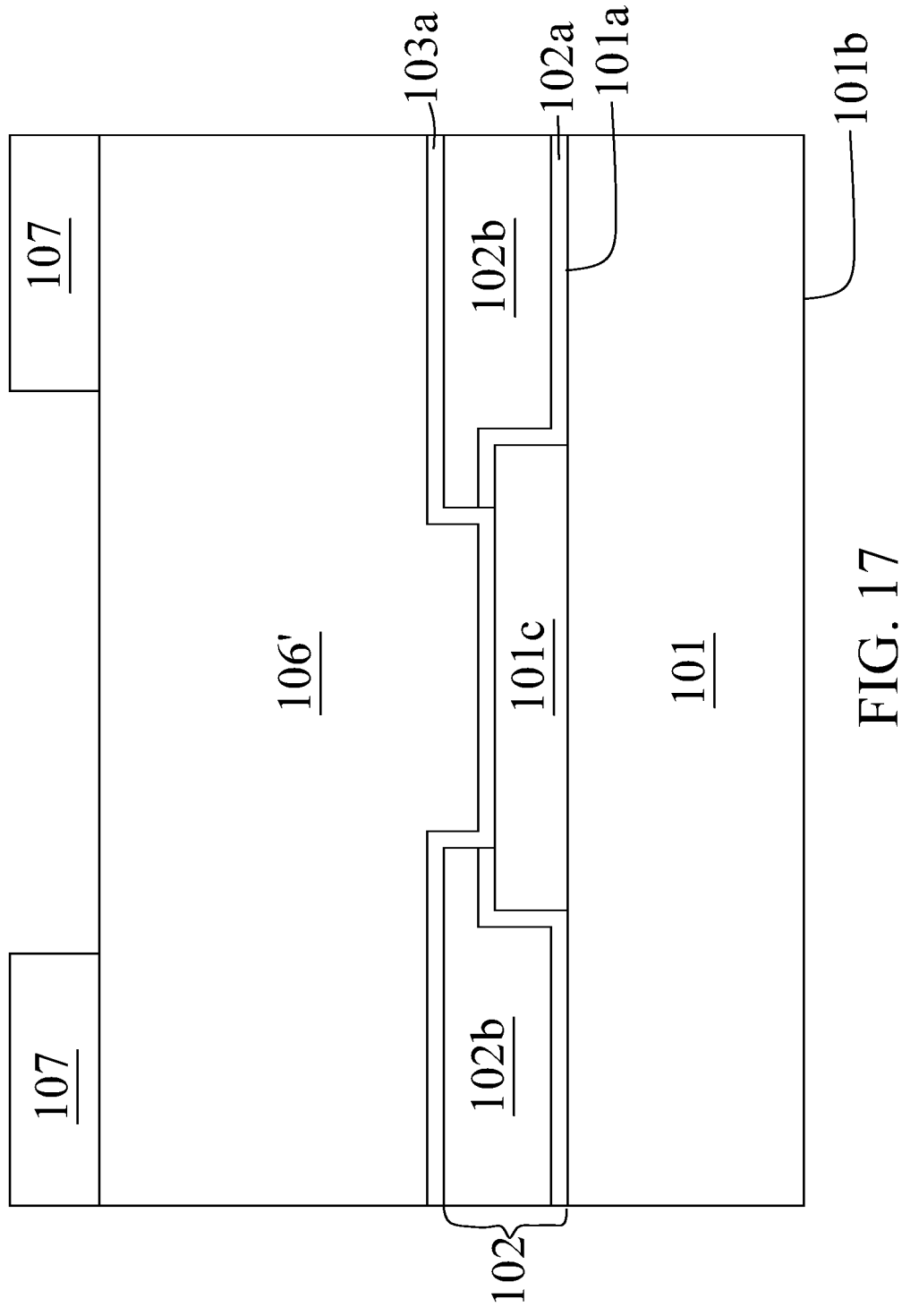
Figure 18:
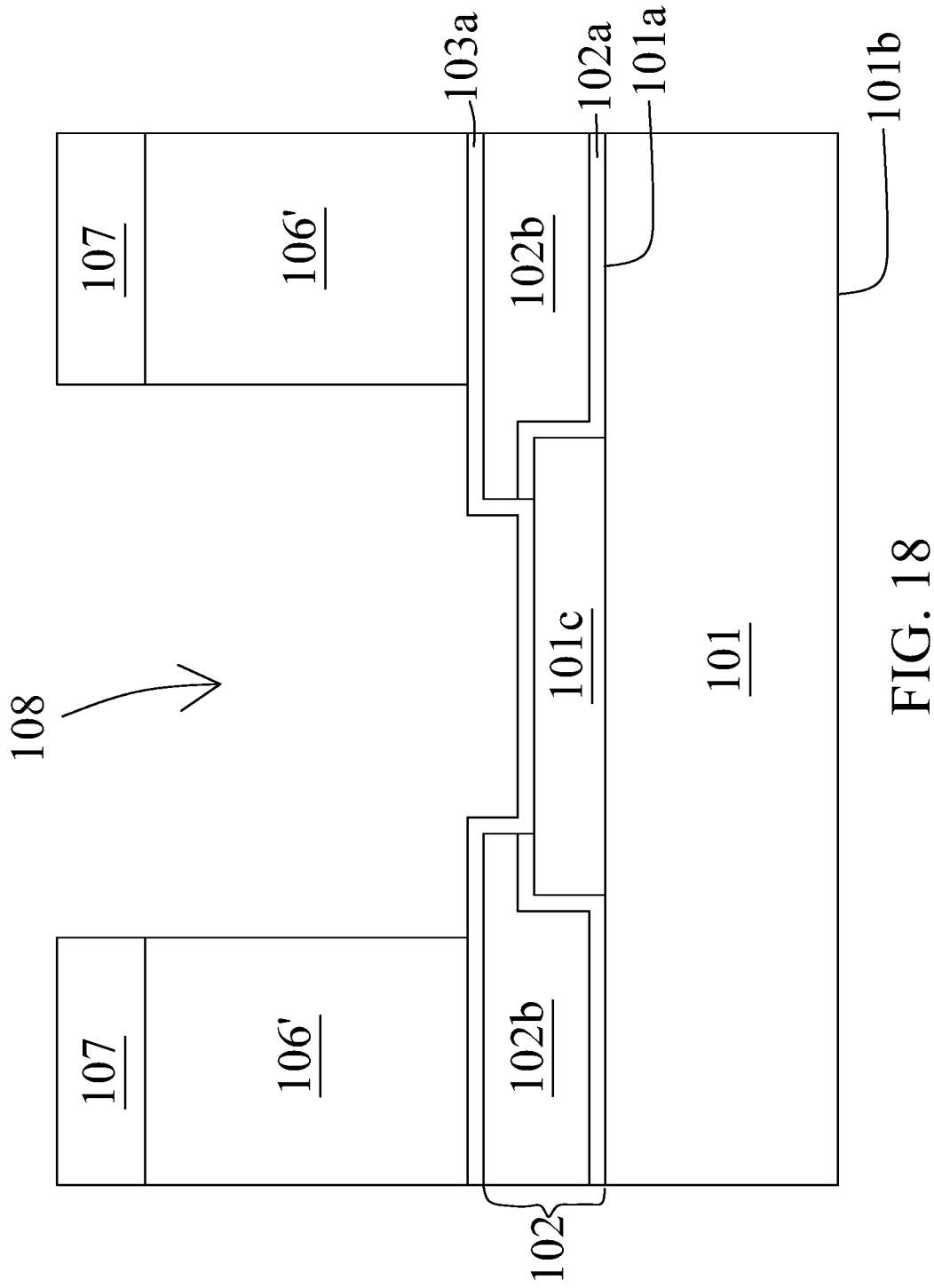
Figure 19:
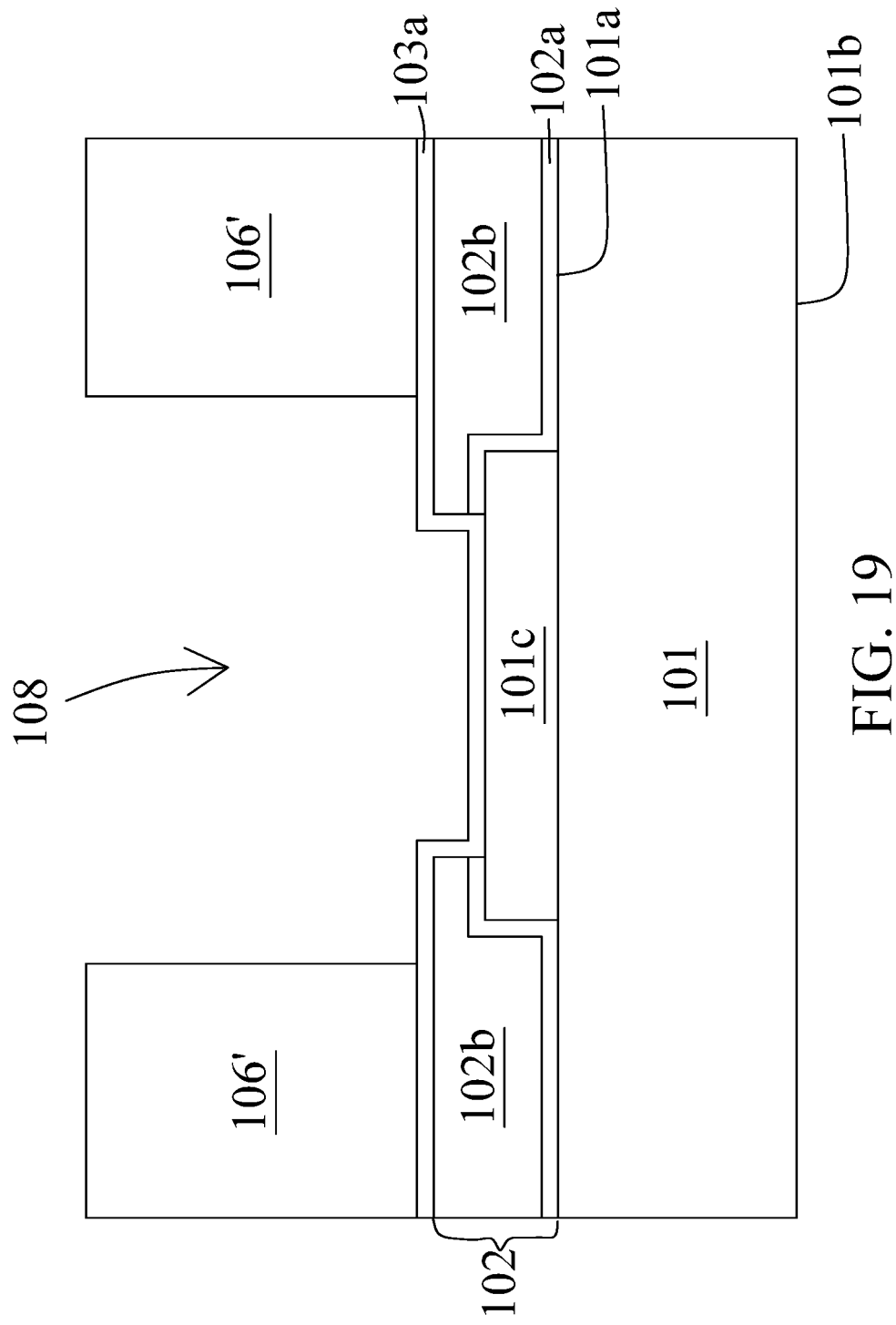
Figure 20:
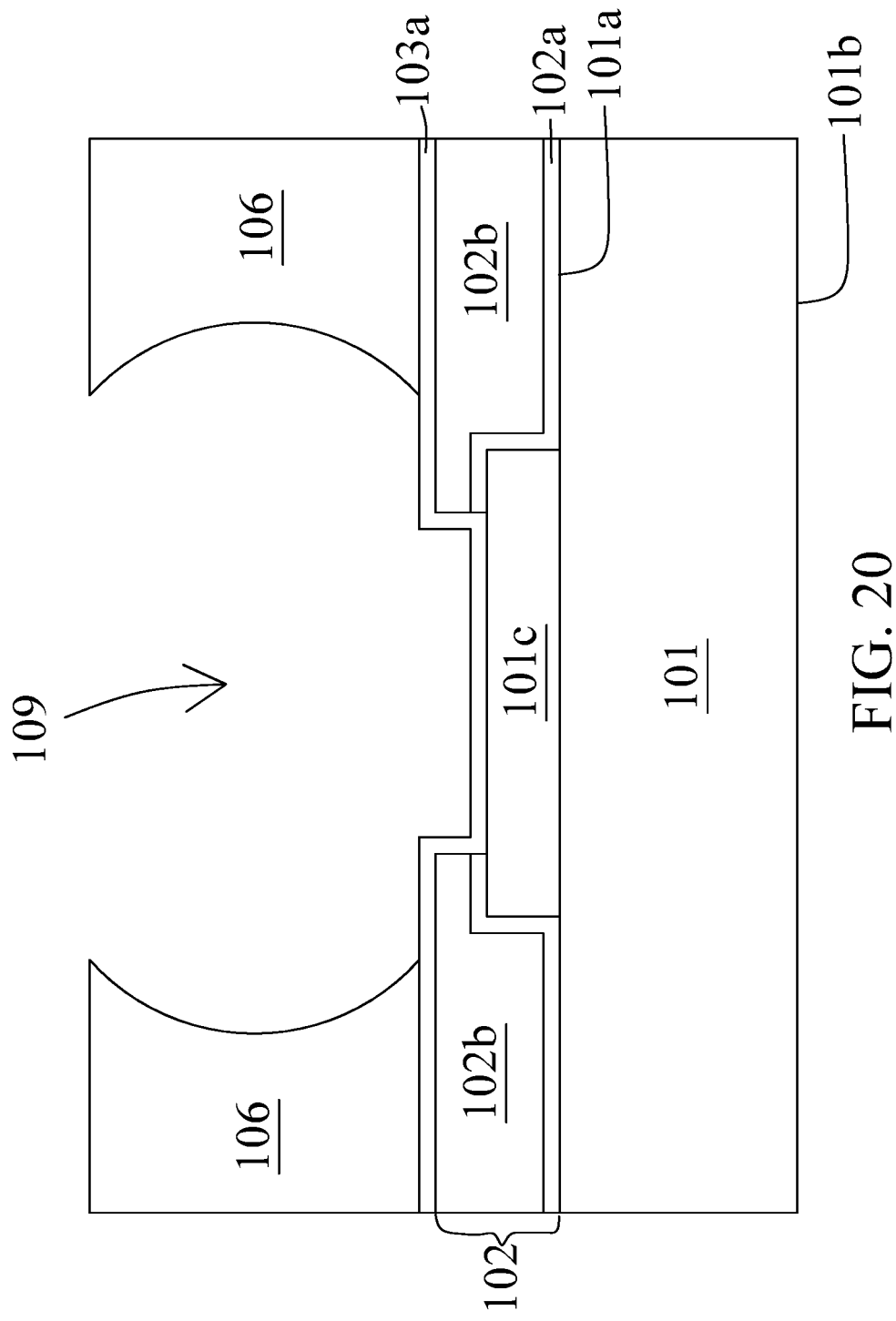

Referring to FIGS. 16 to 20, a patterned mask 106 is formed over the passivation 102 and the first substrate 101 according to step S302 in FIG. 3. In some embodiments, the patterned mask 106 is formed by disposing a mask layer 106' over the passivation 102 and the first pad 101c as shown in FIG. 16, disposing a third photoresist layer 107 partially covering the mask layer 106' as shown in FIG. 17, removing a portion of the mask layer 106' exposed through the third photoresist layer 107 to form a first opening 108 extending through the mask layer 106' as shown in FIG. 18, removing the third photoresist layer 107 as shown in FIG. 19, and then laterally removing the mask layer 106' to widen the first opening 108 to form a second opening 109 extending through the patterned mask 106 as shown in FIG. 20.

In some embodiments, the portion of the mask layer 106' exposed through the third photoresist layer 107 is removed by etching or any other suitable operation. In some embodiments, the mask layer 106' is laterally removed by wet etching or any other suitable process. In some embodiments, the mask layer 106' and the patterned mask 106 include oxide or the like.

In some embodiments, a width of the second opening 109 is substantially greater than a width of the first opening 108. In some embodiments, a sidewall of the second opening is outwardly curved after the lateral removal. In some embodiments, the seed layer 103a is at least partially exposed through the patterned mask 106.

Figure 21:
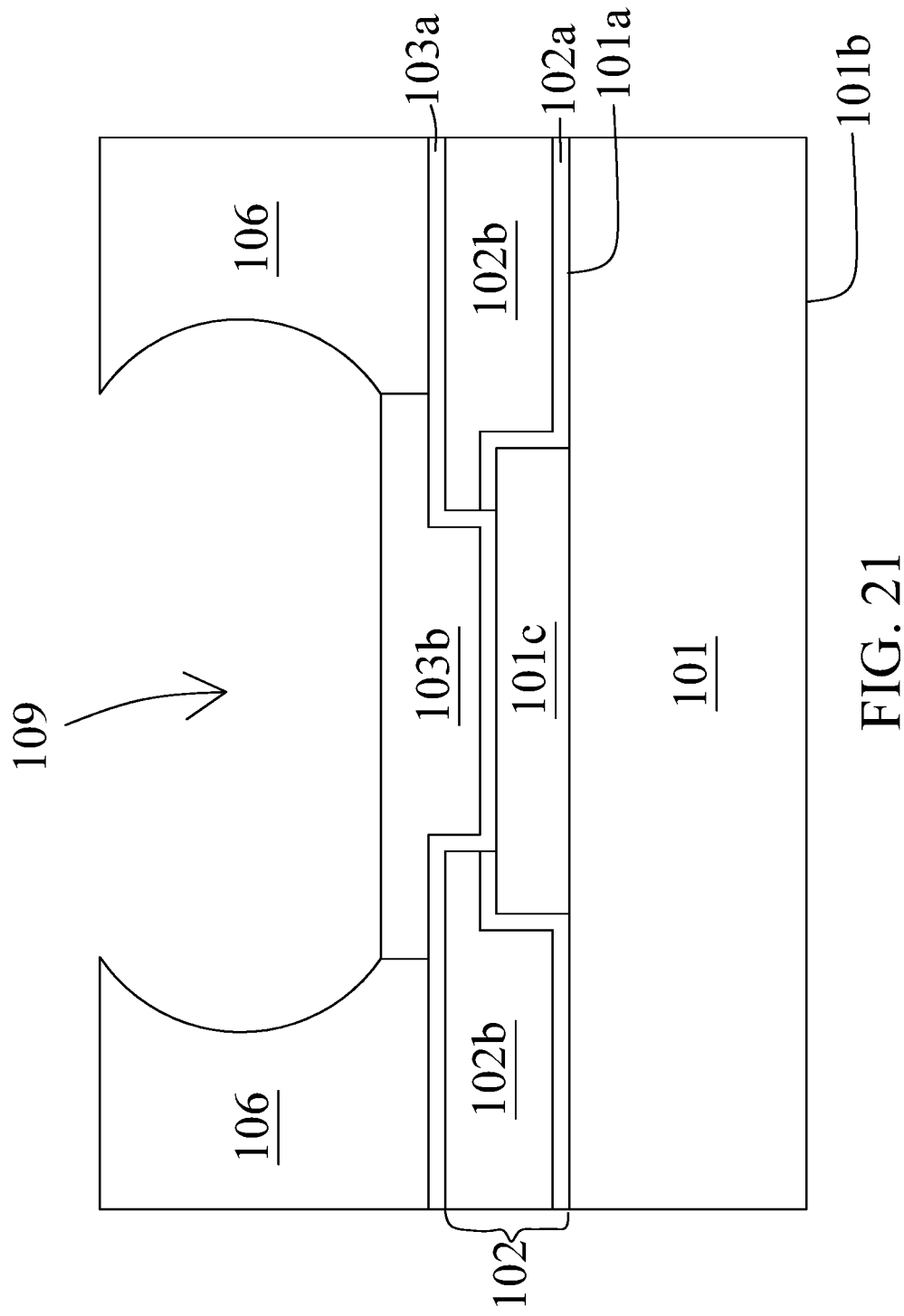

Referring to FIG. 21, a first bump portion 103b is formed over the passivation 102 and the first pad 101c and surrounded by the patterned mask 106 according to step S303 in FIG. 3. In some embodiments, the formation of the first bump portion 103b includes disposing a soldering material on the seed layer 103a and within the second opening 109. In some embodiments, the soldering material is disposed by plating or any other suitable process.

In some embodiments, the first bump portion 103b is in contact with the seed layer 103a. In some embodiments, the first bump portion 103b extends through the passivation 102 toward the first pad 101c. In some embodiments, the first bump portion 103b includes low-temperature reflowable material. In some embodiments, the first bump portion 103b includes soldering material such as tin, lead, silver, copper, nickel, bismuth, or a combination thereof. In some embodiments, the first bump portion 103b includes alloy of tin and silver. In some embodiments, the first bump portion 103b has a configuration similar to that of the first bump portion 103b illustrated in FIG. 1 or 2 and discussed above.

Figure 22:
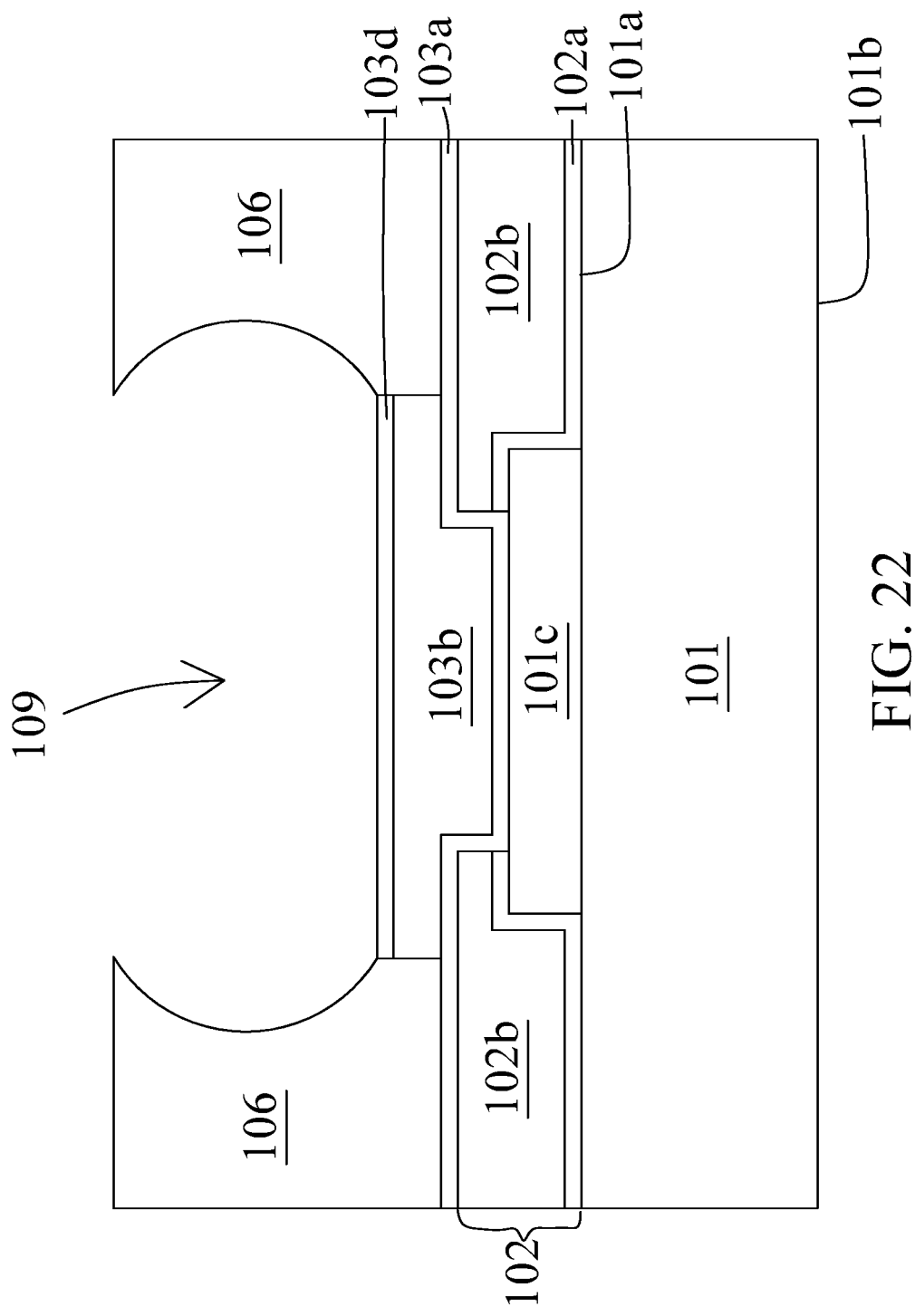

Referring to FIG. 22, a first layer 103d of an interfacial layer 103c is formed over the first bump portion 103b and is surrounded by the patterned mask 106 according to step S304 in FIG. 3. In some embodiments, the first layer 103d of the interfacial layer 103c is formed on the first bump portion 103b and within the second opening 109.

In some embodiments, the formation of the first layer 103d of the interfacial layer 103c includes disposing a nitride on the first bump portion 103b by plating or any other suitable process. In some embodiments, the first layer 103d includes nitride or the like. In some embodiments, the first layer 103d of the interfacial layer 103c has a configuration similar to that of the first layer 103d illustrated in FIG. 1 or 2 and discussed above.

Figure 23:
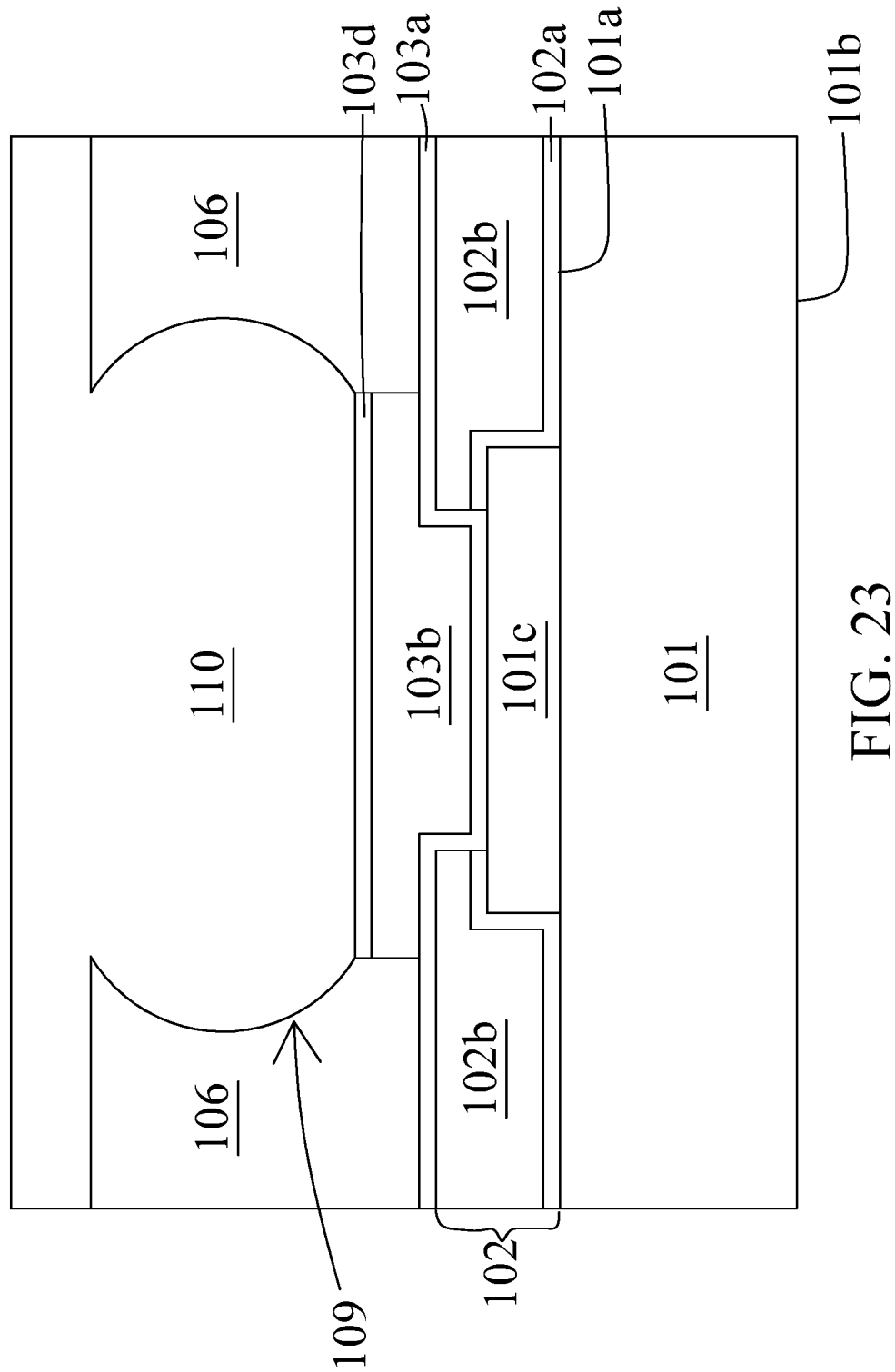
Figure 24:
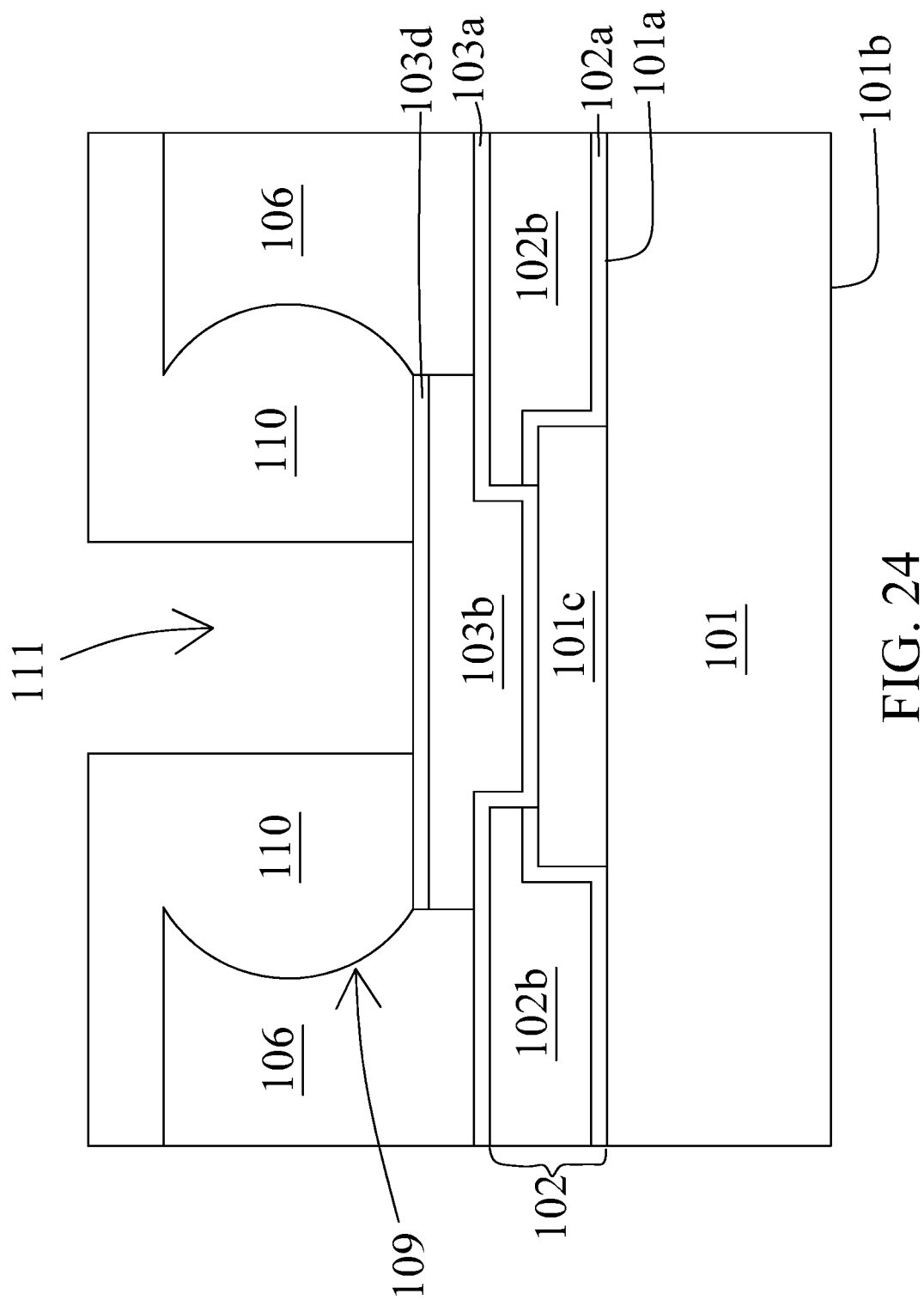
Figure 25:
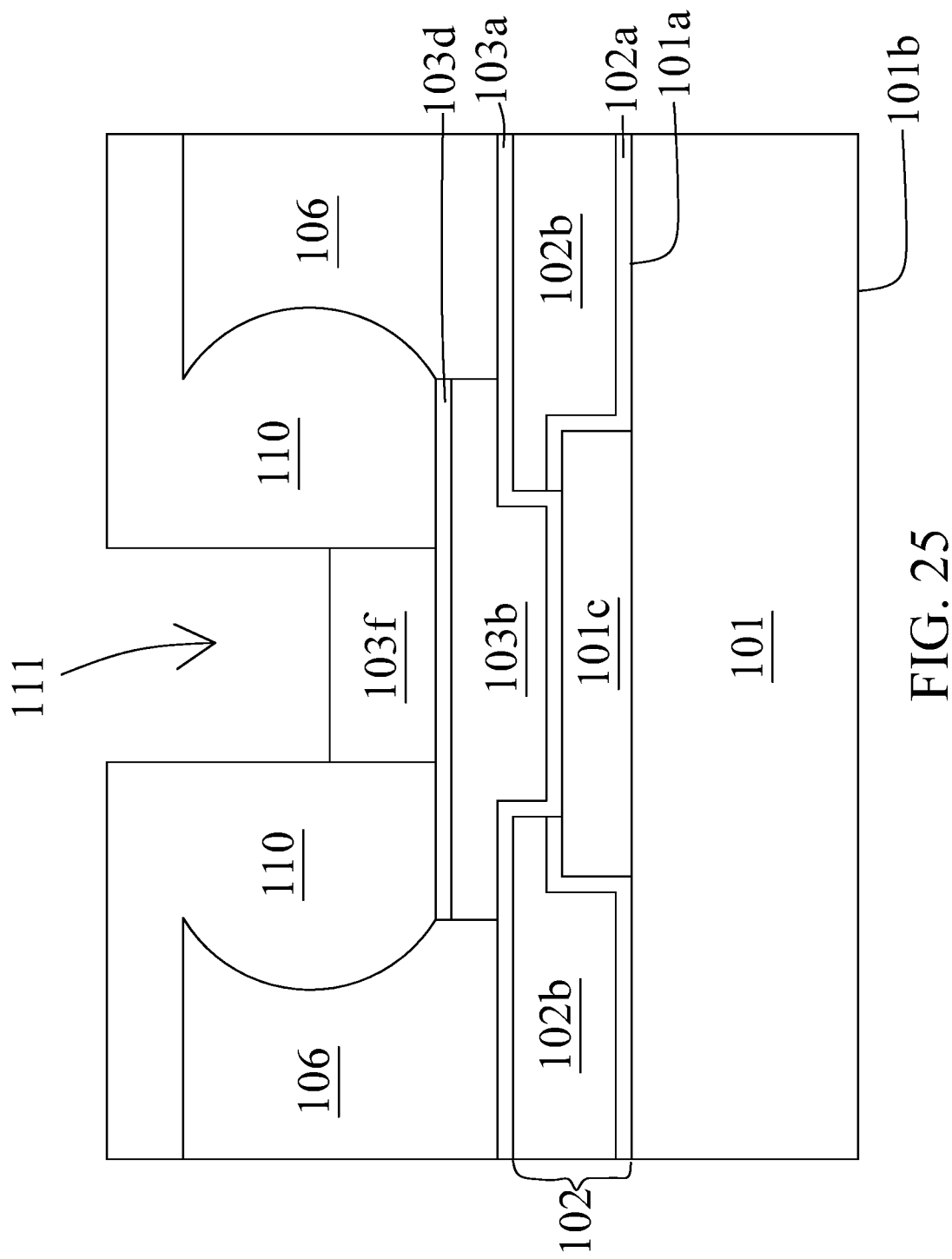
Figure 26:
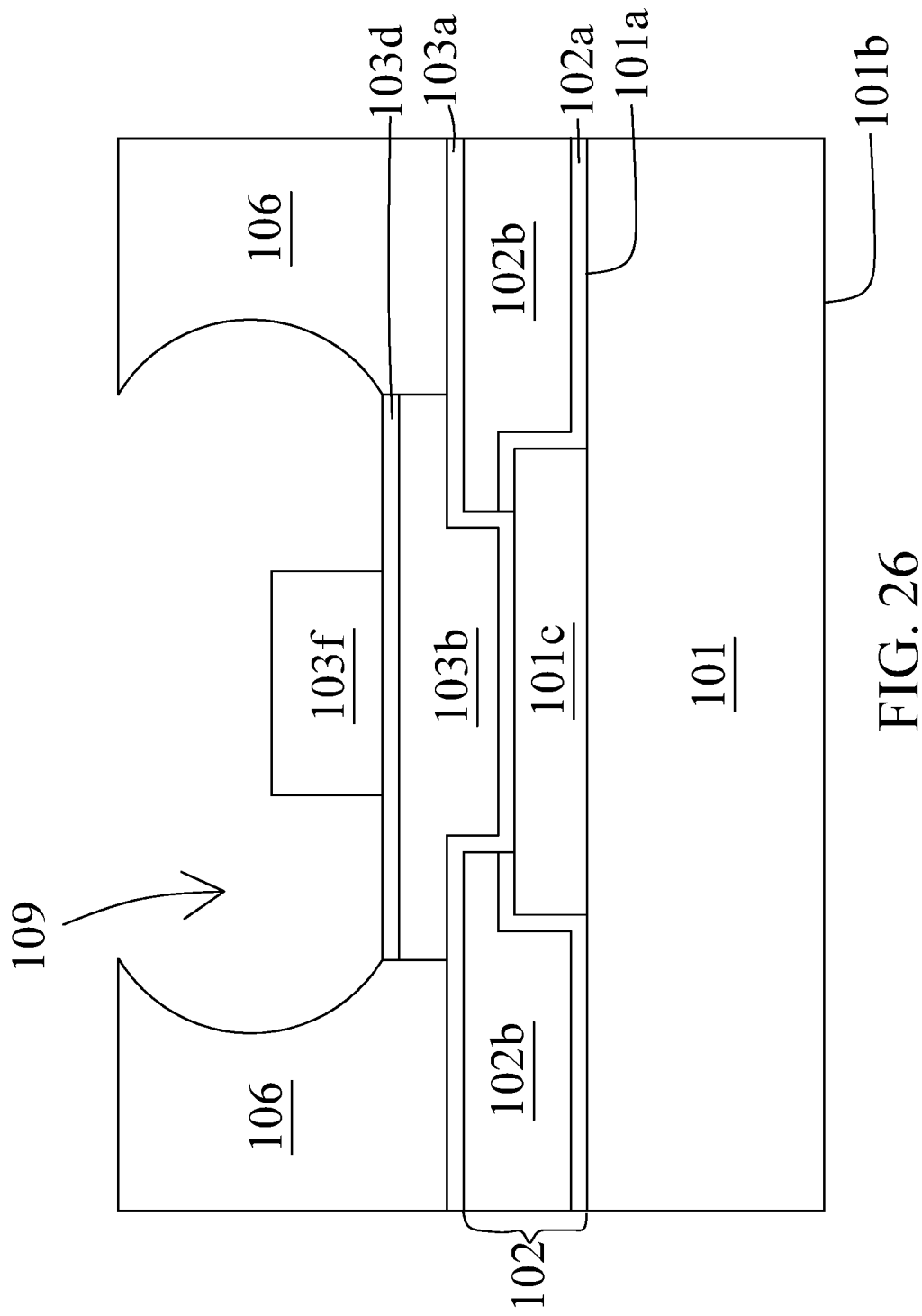

Referring to FIGS. 23 to 26, a conductive pillar 103f is formed on the first layer 103d of the interfacial layer 103c according to step S305 in FIG. 3. In some embodiments, the formation of the conductive pillar 103f includes disposing a fourth photoresist layer 110 over the patterned mask 106 and the first layer 103d of the interfacial layer 103c and within the second opening 109 as shown in FIG. 23, removing a portion of the fourth photoresist layer 110 to form a third opening 111 as shown in FIG. 24, disposing a conductive material within the third opening 111 to form the conductive pillar 103f as shown in FIG. 25, and removing the fourth photoresist layer 110 as shown in FIG. 26.

In some embodiments, the portion of the fourth photoresist layer 110 is removed by etching or any other suitable process. In some embodiments, the conductive material is disposed by electroplating or any other suitable process. In some embodiments, the conductive material is disposed on the first layer 103d of the interfacial layer 103c. In some embodiments, the fourth photoresist layer 110 is removed by stripping, etching, ashing or any other suitable process.

In some embodiments, the conductive material includes gold, silver, copper, nickel, tungsten, aluminum, tin, alloys thereof or the like. In some embodiments, the first bump portion 103b is substantially softer than the conductive pillar 103f. In some embodiments, a Young's modulus of the conductive pillar 103f is substantially greater than a Young's modulus of the first bump portion 103b. In some embodiments, the conductive pillar 103f has a cylindrical shape.

In some embodiments, the conductive pillar 103f is a copper pillar. In some embodiments, the conductive pillar 103f is formed within the second opening 109 and surrounded by the patterned mask 106. In some embodiments, the conductive pillar 103f has a configuration similar to that of the conductive pillar 103f illustrated in FIG. 1 or 2 and discussed above.

Figure 27:
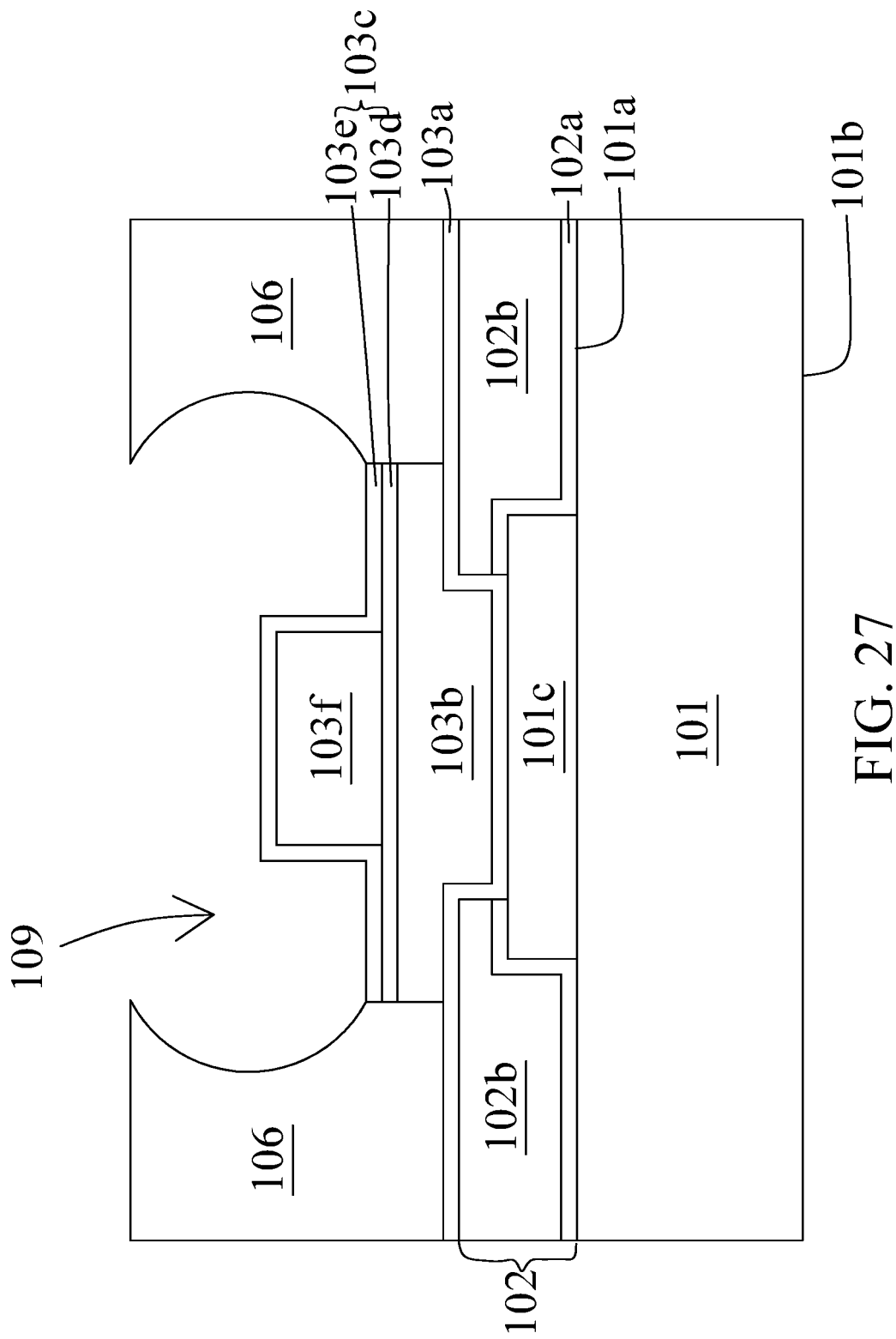

Referring to FIG. 27, a second layer 103e of the interfacial layer 103c is formed on the first layer 103d and covers the conductive pillar 103f according to step S306 in FIG. 3. In some embodiments, the second layer 103e of the interfacial layer 103c is formed within the second opening 109 and is surrounded by the patterned mask 106. In some embodiments, the formation of the second layer 103e of the interfacial layer 103c includes disposing a nitride on the first layer 103d and the conductive pillar 103f by plating or any other suitable process.

In some embodiments, the second layer 103e includes nitride or the like. In some embodiments, the formation of the first layer 103d is similar to the formation of the second layer 103e. In some embodiments, the first layer 103d and the second layer 103e include a same material. In some embodiments, the second layer 103e of the interfacial layer 103c has a configuration similar to that of the second layer 103e illustrated in FIG. 1 or 2 and discussed above. The interfacial layer 103c surrounding the entire conductive pillar 103f is formed.

Figure 28:
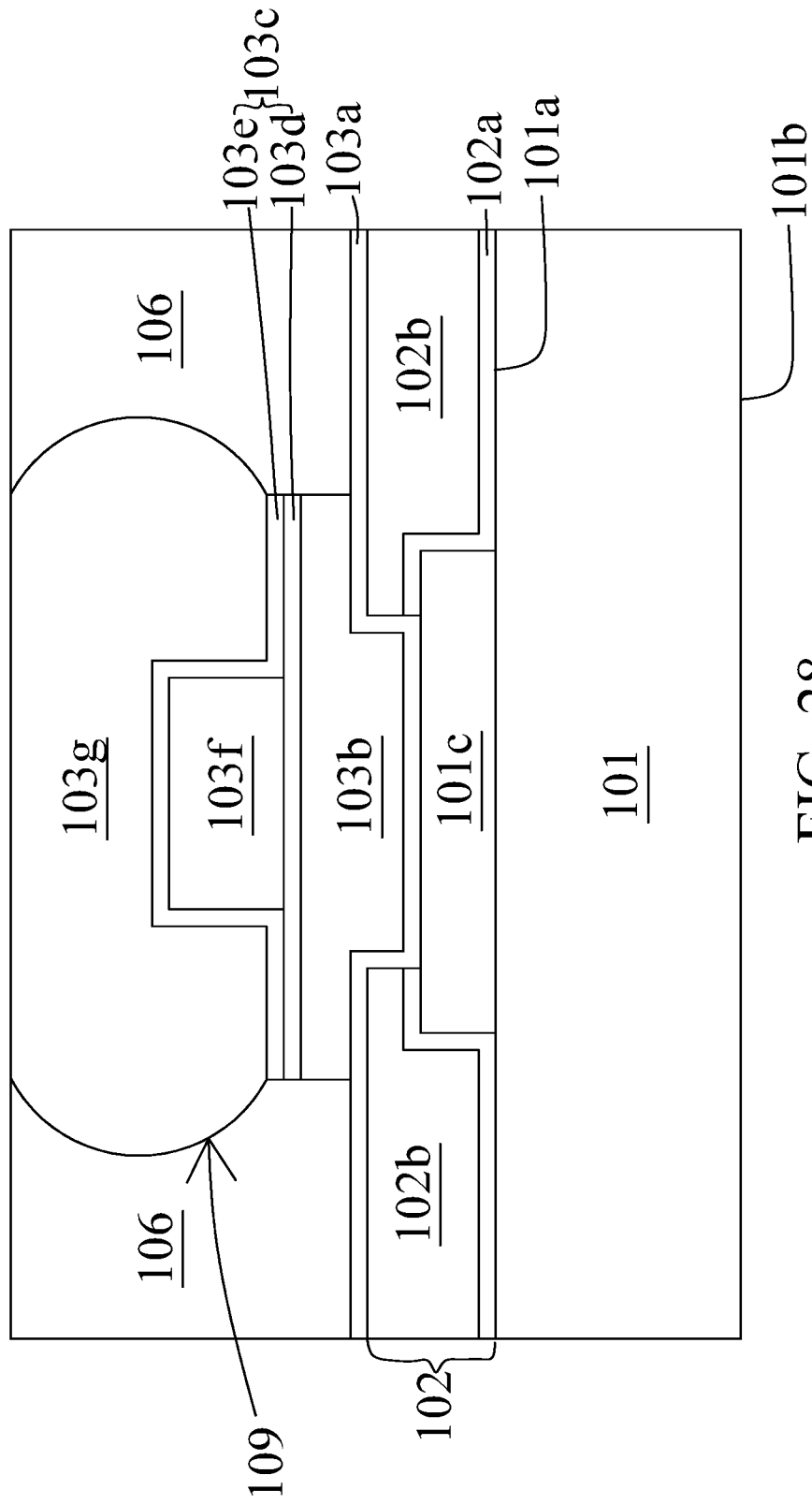

Referring to FIG. 28, a second bump portion 103g is formed over the second layer 103e of the interfacial layer 103c and is surrounded by the patterned mask 106 according to step S307 in FIG. 3. In some embodiments, the formation of the second bump portion 103g includes disposing a soldering material on the second layer 103e and within the second opening 109. In some embodiments, the soldering material is disposed by plating or any other suitable process. In some embodiments, the first bump portion 103b, the first layer 103*d* of the interfacial layer 103*c*, the conductive pillar 103*f*, the second layer 103*e* of the interfacial layer 103*c* and the second bump portion 103*g* are formed within the second opening 109.

In some embodiments, the second bump portion 103*g* includes low-temperature reflowable material. In some embodiments, the second bump portion 103*g* includes soldering material such as tin, lead, silver, copper, nickel, bismuth, or a combination thereof. In some embodiments, second bump portion 103*g* includes alloy of tin and silver. In some embodiments, the second bump portion 103*g* has a configuration similar to that of the second bump portion 103*g* illustrated in FIG. 1 or 2 and discussed above.

Figure 29:
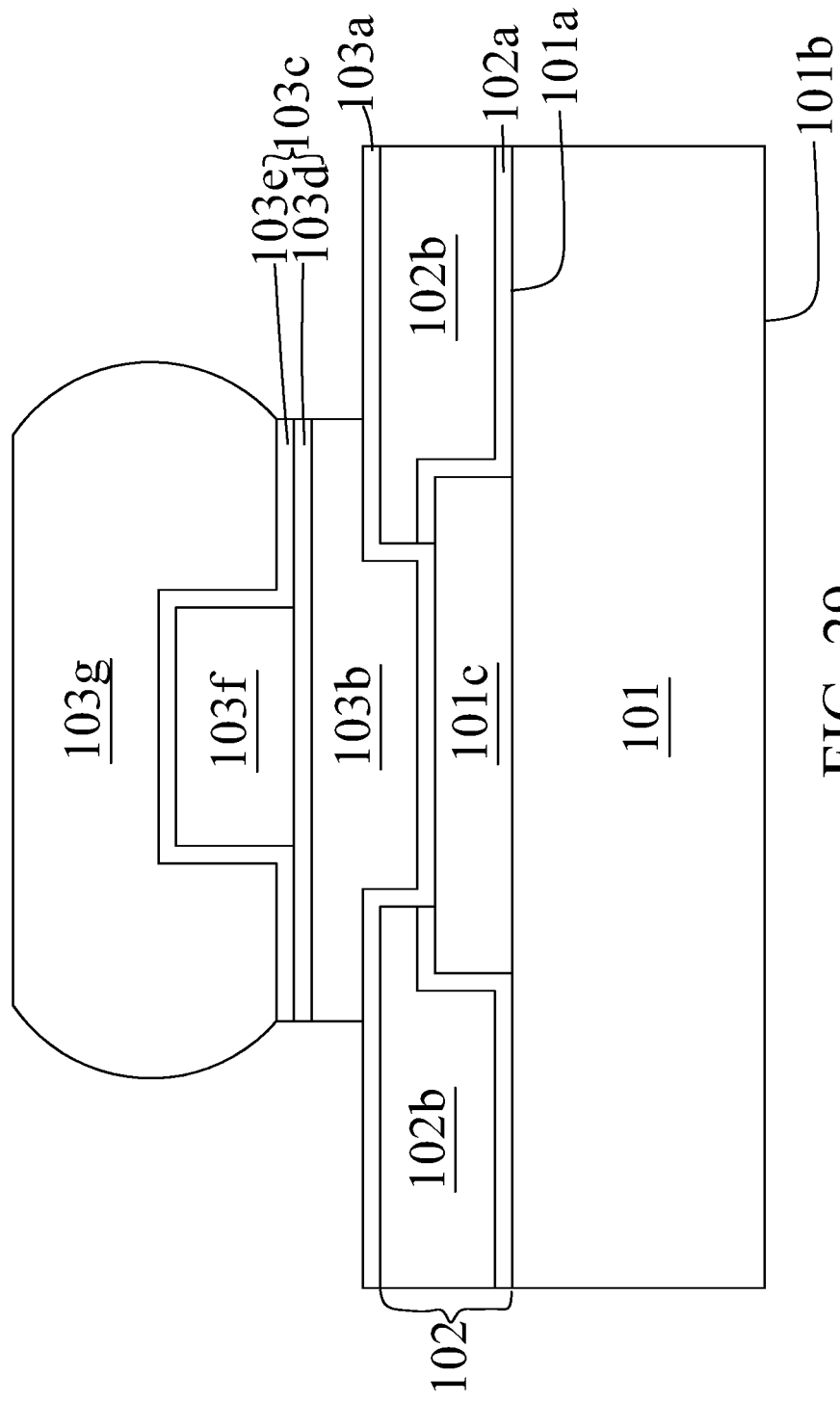

Referring to FIG. 29, the patterned mask 106 is removed according to step S308 in FIG. 3. In some embodiments, the patterned mask 106 is removed by etching or any other suitable process. In some embodiments, a portion of the seed layer 103*a* is exposed by the first bump portion 103*b* after the removal of the patterned mask 106 as shown in FIG. 29.

Figure 30:
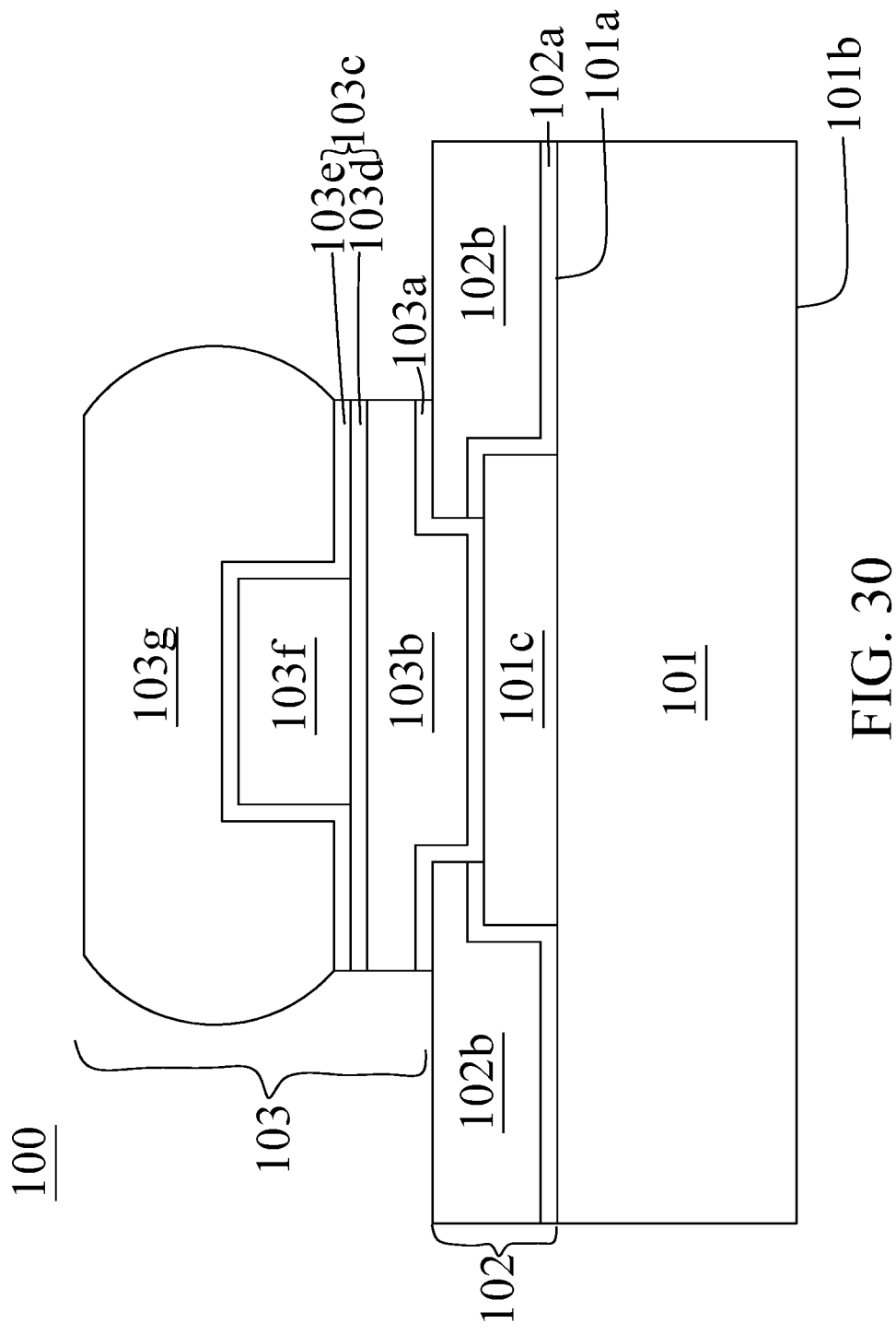

In some embodiments, the portion of the seed layer 103*a* exposed by the first bump portion 103*b* is removed by stripping, etching or any other suitable process. The first semiconductor structure 100 is formed as shown in FIG. 30. In some embodiments, the first semiconductor structure 100 has a configuration similar to that of the first semiconductor structure 100 illustrated in FIG. 1 or 2 and discussed above. Because the conductive pillar 103*f* is disposed within the conductive bump structure 103, an overall strength of the conductive bump structure 103 is increased or improved.

Figure 31:
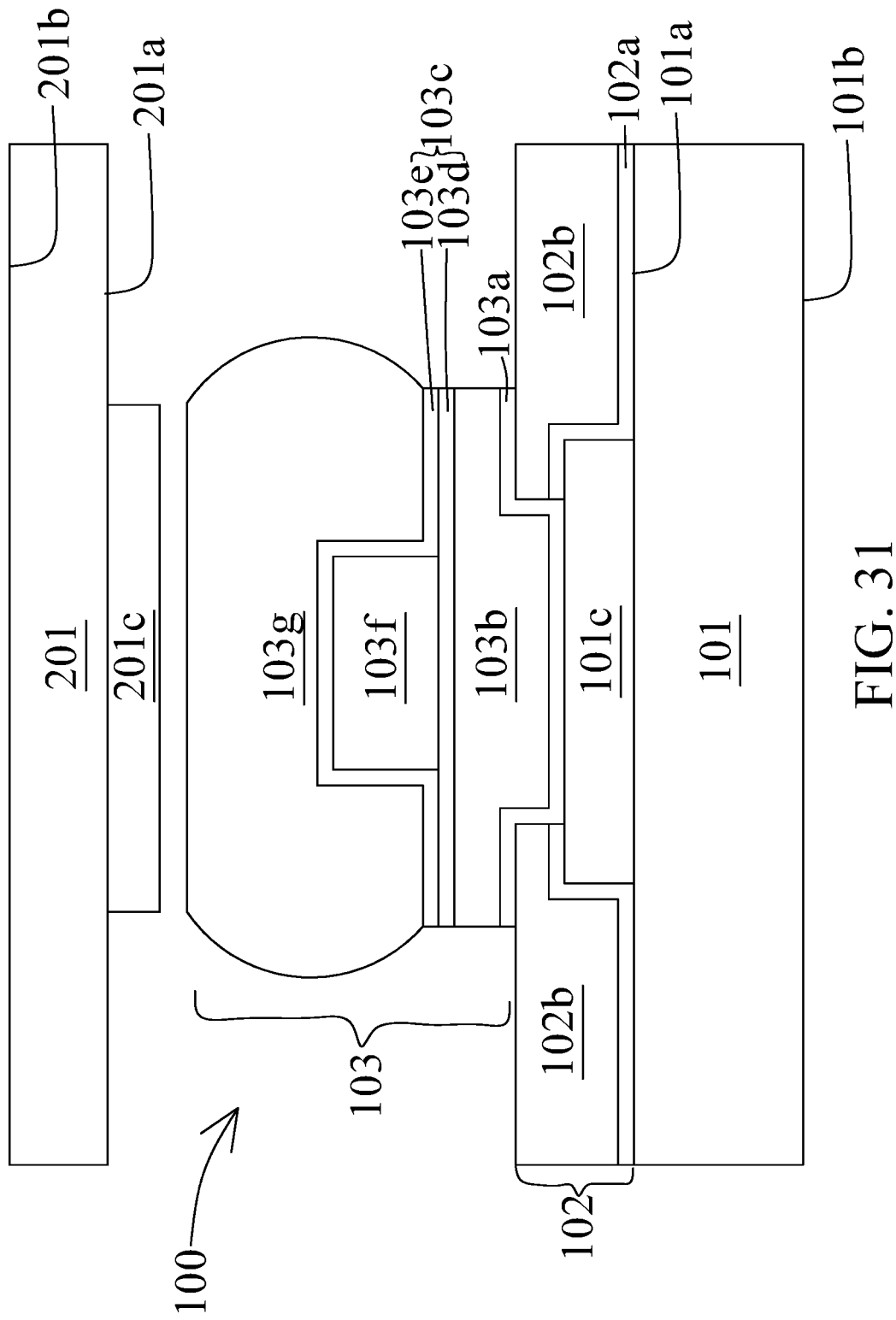

After the formation of the first semiconductor structure 100, the first semiconductor structure 100 is bonded to a second substrate 201 via a second pad 201*c* disposed on the second substrate 201. In some embodiments, the second substrate 201 having the second pad 201*c* disposed on the second substrate 201 is provided as shown in FIG. 31. In some embodiments, the second substrate 201 is disposed above the first substrate 101 and the conductive bump structure 103.

In some embodiments, the second substrate 201 is a die substrate. In some embodiments, the second substrate 201 includes a semiconductive layer. In some embodiments, the second substrate 201 includes semiconductive material such as silicon, germanium, gallium, arsenic, or a combination thereof. In some embodiments, the second substrate 201 is a silicon substrate.

In some embodiments, the second substrate 201 is defined with a third surface 201*a* and a fourth surface 201*b* opposite to the third surface 201*a*. In some embodiments, the third surface 201*a* is a front side of the second substrate 201, and the fourth surface 201*b* is a back side of the second substrate 201. In some embodiments, various features are formed in or over the third surface 201*a* of the second substrate 201.

In some embodiments, the second pad 201*c* is formed on the second substrate 201. In some embodiments, the second pad 201*c* is disposed on the third surface 201*a* of the second substrate 201. In some embodiments, the second pad 201*c* is configured to connect the component or circuitry of the second substrate 201 to an external interconnection.

In some embodiments, the second pad 201*c* includes conductive material such as gold, silver, copper, nickel, tungsten, aluminum, tin, alloys thereof or the like. In some embodiments, the second pad 201*c* is an aluminum pad. In some embodiments, the second pad 201*c* protrudes from the third surface 201*a* of the second substrate 201. In some embodiments, the second substrate 201 and the second pad 201*c* respectively have configurations similar to those of the second substrate 201 and the second pad 201*c* illustrated in FIG. 1 or 2 and discussed above.

Figure 32:
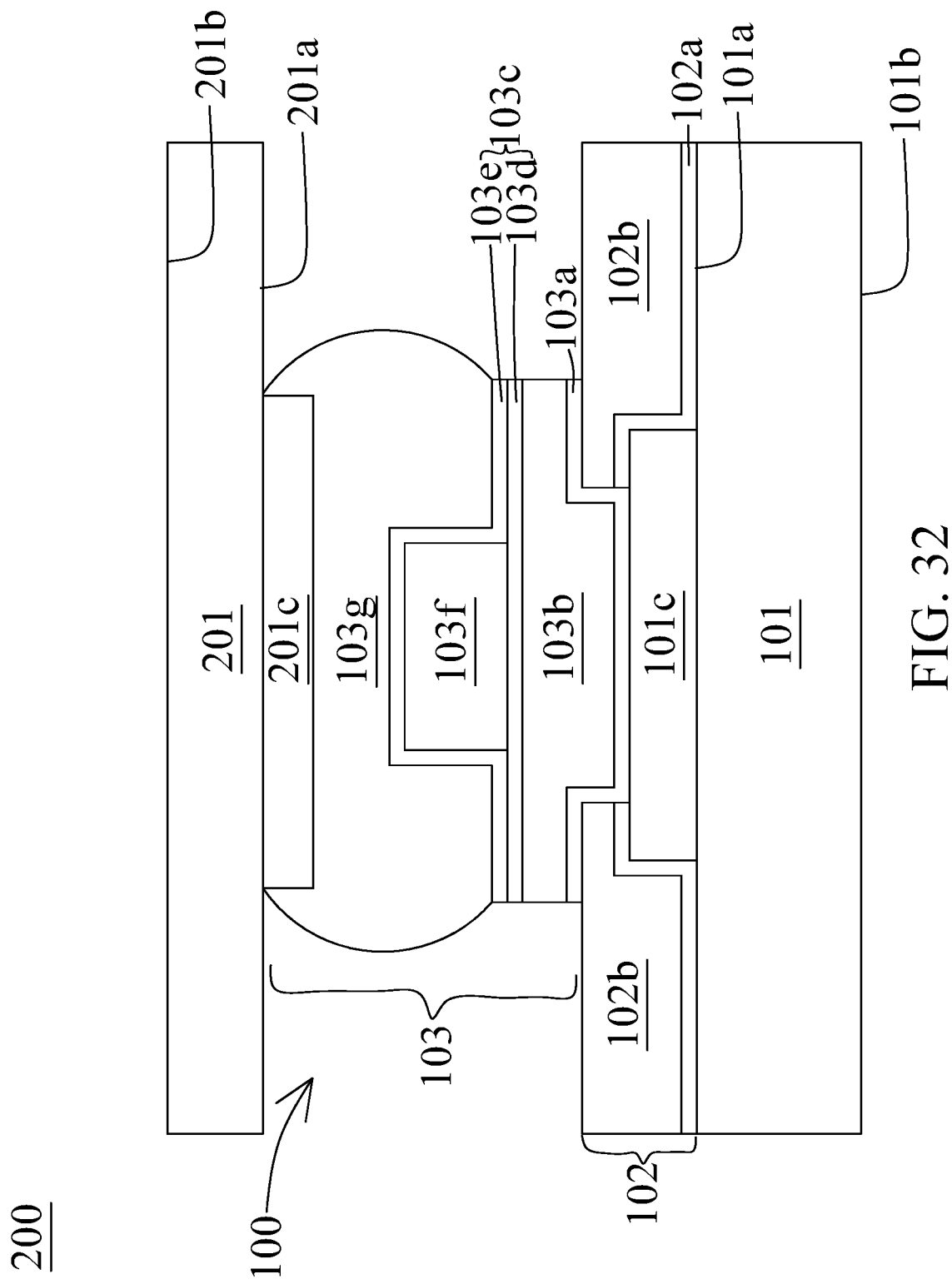

After the provision of the second substrate 201 and the second pad 201*c* above the first semiconductor structure 100, the second pad 201*c* is bonded to the conductive bump structure 103 of the first semiconductor structure 100 as shown in FIG. 32. In some embodiments, the second pad 201*c* is bonded to the second bump portion 103*g* of the first semiconductor structure 100.

In some embodiments, the second pad 201*c* is pressed toward the second bump portion 103*g* during the bonding. In some embodiments, a bonding force is applied to press the second substrate 201 toward the second bump portion 103*g* during the bonding. In some embodiments, the second bump portion 103*g* is deformable during the bonding. When a large bonding force on the conductive bump structure 103 is generated during the bonding, the conductive bump structure 103 with the improved strength can withstand the large bonding force with minimum deformation. Therefore, bridging between the adjacent conductive bump structures 103 can be prevented.

In some embodiments, the second pad 201*c* is in contact with the second bump portion 103*g* after the bonding. In some embodiments, the second pad 201*c* protrudes into the second bump portion 103*g* and is at least partially surrounded by the second bump portion 103*g*.

In some embodiments, the interfacial layer 103*c* of the first semiconductor structure 100 is spaced apart from the second pad 201*c* by the second bump portion 103*g*. In some embodiments, the conductive pillar 103*f* is disposed between the first pad 101*c* and the second pad 201*c*. In some embodiments, the conductive pillar 103*f* is spaced apart from the second pad 201*c* by the second layer 103*e* of the interfacial layer 103*c* and the second bump portion 103*g*.

In conclusion, because a conductive pillar is disposed within a conductive bump structure, an overall strength of the conductive bump structure is increased or improved. Further, a large bonding force on the conductive bump structure is generated during a bonding of a die over a substrate. As such, the conductive bump structure with the improved strength can withstand the large bonding force with minimum deformation. Therefore, bridging between the adjacent conductive bump structures can be prevented. A reliability of a semiconductor structure having such strengthened conductive bump structure is increased or improved.

One aspect of the present disclosure provides a semiconductor structure. The semiconductor structure includes a substrate having a pad disposed thereon and a passivation at least partially surrounding the pad; and a conductive bump structure disposed over the substrate and the pad, wherein the conductive bump structure includes a first bump portion disposed over the passivation and the pad, a conductive pillar disposed over the first bump portion, and a second bump portion disposed over and surrounding the conductive pillar.

Another aspect of the present disclosure provides a semiconductor structure. The semiconductor structure includes a first substrate having a first pad disposed thereon and a passivation at least partially surrounding the first pad; a conductive bump structure disposed over the first substrate and the first pad; and a second substrate having a second pad disposed thereon and bonded to the conductive bump structure, wherein the conductive bump structure includes a first bump portion disposed over the passivation and the pad, a conductive pillar disposed over the first bump portion, an interfacial layer over the conductive pillar, and a second bump portion disposed over the interfacial layer and surrounding the interfacial layer and the conductive pillar.

Another aspect of the present disclosure provides a method of manufacturing a semiconductor structure. The method includes steps of providing a first substrate having a first pad disposed thereon and a passivation at least partially surrounding the first pad; forming a patterned mask over the passivation; forming a first bump portion over the passivation and the first pad and surrounded by the patterned mask; forming a first layer of an interfacial layer over the first bump portion and surrounded by the patterned mask; forming a conductive pillar on the first layer of the interfacial layer; forming a second layer of the interfacial layer on the first layer and covering the conductive pillar; forming a second bump portion over the second layer of the interfacial layer and surrounded by the patterned mask; and removing the patterned mask.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate having a first pad disposed thereon and a passivation at least partially surrounding the pad; and
a conductive bump structure disposed over the substrate and the pad,
wherein the conductive bump structure comprises a first bump portion disposed over the passivation and the pad, a conductive pillar disposed over the first bump portion, a second bump portion disposed over and surrounding the conductive pillar, and an interfacial layer surrounding the conductive pillar, wherein the interfacial layer is made of dielectric material;
wherein the first bump portion and the second bump portion are made of same material;
wherein the first bump portion is softer than the conductive pillar;
wherein the first bump portion is separated from the second bump portion by the interfacial layer to prevent an electrical contact between the first bump portion and the second bump portion;
wherein the second bump portion has two convex sidewalls and a flat top surface;
wherein the second bump portion is deformable by force;
wherein a width of the second bump portion between the two convex sidewalls is greater than a width of the first bump portion;
wherein the conductive pillar is separated from the first bump portion and the second bump portion by the interfacial layer to prevent an electrical contact between the conductive pillar and the first bump portion, and between the conductive pillar and the second bump portion.

2. The semiconductor structure of claim 1, wherein the conductive pillar is disposed between the first bump portion and the second bump portion, and at least a portion of the first bump portion extends through the passivation;
wherein the passivation comprises:
a first passivation layer disposed on a top surface of the substrate and partially covering the first pad; and
a second passivation layer disposed on the first passivation layer and partially covering the first pad;
wherein a thickness of the first passivation layer is less than a thickness of the second passivation layer;
wherein the first bump portion is extended through the first passivation layer and the second passivation layer toward the first pad;
wherein the first passivation layer and the second passivation layer include different materials.

3. The semiconductor structure of claim 1, wherein a height of the second bump portion is substantially greater than a height of the first bump portion.

4. The semiconductor structure of claim 1, wherein the interfacial layer includes nitride, wherein the conductive pillar is enclosed by the interfacial layer.

5. The semiconductor structure of claim 4, a width of the first bump portion is equal to a width of the passivation.

6. The semiconductor structure of claim 2, wherein the conductive bump structure further comprises a seed layer disposed over the passivation, on the pad and under the first bump portion;
wherein the seed layer is in contact with the first pad exposed through the first passivation layer and the second passivation layer of the passivation;
wherein a width of the seed layer is equal to the width of the first passivation layer and is equal to the second passivation layer;
wherein the first bump portion is formed between the second passivation layer and the seed layer.

7. A semiconductor structure, comprising:
a first substrate having a first pad disposed thereon and a passivation at least partially surrounding the first pad;
a conductive bump structure disposed over the first substrate and the first pad; and
a second substrate having a second pad disposed thereon and bonded to the conductive bump structure,
wherein the conductive bump structure includes a first bump portion disposed over the passivation and the pad, a conductive pillar disposed over the first bump portion, an interfacial layer surrounding the conductive pillar, and a second bump portion disposed over the interfacial layer and surrounding the interfacial layer and the conductive pillar.

8. The semiconductor structure of claim 7, wherein the second pad is in contact with and at least partially surrounded by the second bump portion.

9. The semiconductor structure of claim 7, wherein the interfacial layer is spaced apart from the second pad by the second bump portion, and a width of the second bump portion is substantially greater than a width of the second pad.

10. The semiconductor structure of claim 7, wherein the conductive pillar is disposed between the first pad and the second pad, and the second bump portion is softer than the conductive pillar.

11. The semiconductor structure of claim 7, wherein the first bump portion and the second bump portion include solder, and the second substrate is disposed above the first substrate.

12. A method of manufacturing a semiconductor structure, comprising:
providing a first substrate having a first pad disposed thereon and a passivation at least partially surrounding the first pad;
forming a patterned mask over the passivation;
forming a first bump portion over the passivation and the first pad and surrounded by the patterned mask;
forming a first layer of an interfacial layer over the first bump portion and surrounded by the patterned mask;
forming a conductive pillar on the first layer of the interfacial layer;
forming a second layer of the interfacial layer on the first layer and covering the conductive pillar;
forming a second bump portion over the second layer of the interfacial layer and surrounded by the patterned mask; and
removing the patterned mask.

13. The method of claim 12, wherein the patterned mask includes oxide, the formation of the patterned mask includes disposing a mask layer over the passivation and the first pad, disposing a first photoresist layer partially covering the mask layer, and removing a portion of the mask layer exposed through the first photoresist layer to form a first opening extending through the mask layer.

14. The method of claim 13, further comprising laterally removing the mask layer by wet etching to widen the first opening to form a second opening after the formation of the first opening; wherein a width of the second opening is substantially greater than a width of the first opening; a sidewall of the second opening is outwardly curved; and the first bump portion, the first layer of the interfacial layer, the conductive pillar, the second layer of the interfacial layer and the second bump portion are formed within the second opening.

15. The method of claim 14, wherein the formation of the conductive pillar includes disposing a second photoresist layer over the patterned mask and the first layer of the interfacial layer and within the second opening, removing a portion of the second photoresist layer to form a third opening, disposing a conductive material within the third opening to form the conductive pillar, and removing the second photoresist layer.

16. The method of claim 15, wherein the conductive material is disposed on the first layer of the interfacial layer.

17. The method of claim 15, wherein the conductive material is disposed by electroplating.

18. The method of claim 12, further comprising:
providing a second substrate having a second pad disposed thereon;
bonding the second pad to the second bump portion;
wherein a bonding force is applied to press the second substrate toward the second bump portion during the bonding;
wherein the second pad is pressed toward the second bump portion during the bonding;
wherein the second pad is in contact with the second bump portion after the bonding;
wherein the second bump portion is deformable during the bonding.

* * * * *